(12) United States Patent
Dale et al.

(10) Patent No.: US 11,031,432 B2
(45) Date of Patent: Jun. 8, 2021

(54) VERTICAL MICROBOLOMETER CONTACT SYSTEMS AND METHODS

(71) Applicant: FLIR Systems, Inc., Wilsonville, OR (US)

(72) Inventors: James L. Dale, Santa Barbara, CA (US); Christopher Chan, Goleta, CA (US); Eric A. Kurth, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 76 days.

(21) Appl. No.: 16/226,580

(22) Filed: Dec. 19, 2018

(65) Prior Publication Data

US 2019/0148443 A1     May 16, 2019

Related U.S. Application Data

(60) Division of application No. 15/396,100, filed on Dec. 30, 2016, now abandoned, which is a continuation of application No. PCT/US2015/039138, filed on Jul. 2, 2015.

(60) Provisional application No. 62/020,747, filed on Jul. 3, 2014.

(51) Int. Cl.
| | |
|---|---|
| *H01L 27/146* | (2006.01) |
| *H04N 5/33* | (2006.01) |
| *H04N 5/378* | (2011.01) |
| *G01J 5/02* | (2006.01) |
| *G01J 5/20* | (2006.01) |

(52) U.S. Cl.
CPC ........ *H01L 27/14669* (2013.01); *G01J 5/023* (2013.01); *G01J 5/024* (2013.01); *G01J 5/20* (2013.01); *H01L 27/14636* (2013.01); *H01L 27/14683* (2013.01); *H04N 5/33* (2013.01); *H04N 5/378* (2013.01)

(58) Field of Classification Search
CPC ........ H01L 27/14669; H01L 27/14636; H01L 27/14683; H04N 5/33; H04N 5/378; G01J 5/023; G01J 5/024; G01J 5/20
See application file for complete search history.

(56) References Cited

U.S. PATENT DOCUMENTS

| | | | |
|---|---|---|---|
| 6,046,485 A | 4/2000 | Cole et al. | |
| 6,690,014 B1 * | 2/2004 | Gooch | G01J 5/20 250/338.4 |

(Continued)

OTHER PUBLICATIONS

Kim Young Su et al:, Uncooled Microbolometer Arrays With High Responsivity Using Meshed Leg Structure, Nov. 1, 2013, pp. 2108-2110, vol. 25, No. 21, IEEE Photonics Technology Letters, IEEE Service Center, Piscataway, NJ, US.

*Primary Examiner* — Benjamin Tzu-Hung Liu
(74) *Attorney, Agent, or Firm* — Haynes and Boone, LLP

(57) ABSTRACT

Systems and methods are directed to vertical legs for an infrared detector. For example, an infrared imaging device may include a microbolometer array in which each microbolometer includes a bridge and a vertical leg structure that couples the bridge to a substrate such as a readout integrated circuit. The vertical leg structure may run along a path that is parallel to a plane defined by the bridge and may be oriented perpendicularly to the plane. The path may be disposed within, below, or above the plane defined by the bridge.

20 Claims, 32 Drawing Sheets

(56) References Cited

U.S. PATENT DOCUMENTS

| | | | |
|---|---|---|---|
| 7,709,795 B2* | 5/2010 | Yamanaka | H01L 31/103 |
| | | | 250/338.1 |
| 2010/0171190 A1* | 7/2010 | Liger | H01L 27/14683 |
| | | | 257/428 |
| 2011/0180713 A1 | 7/2011 | Noda | |
| 2012/0132804 A1 | 5/2012 | Lee et al. | |
| 2014/0184807 A1* | 7/2014 | Simolon | H04N 5/378 |
| | | | 348/164 |

* cited by examiner

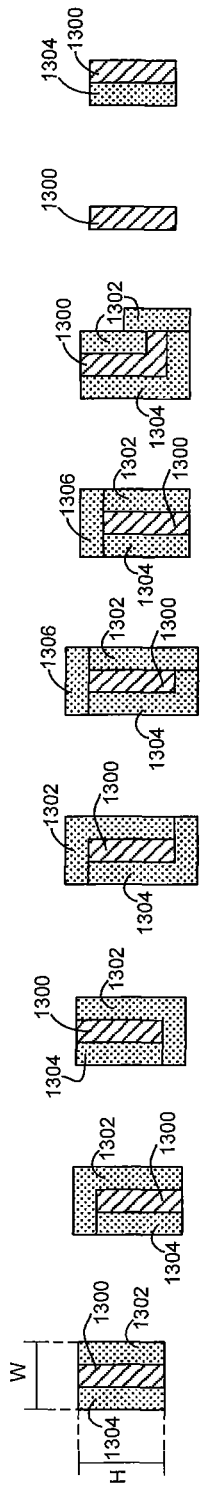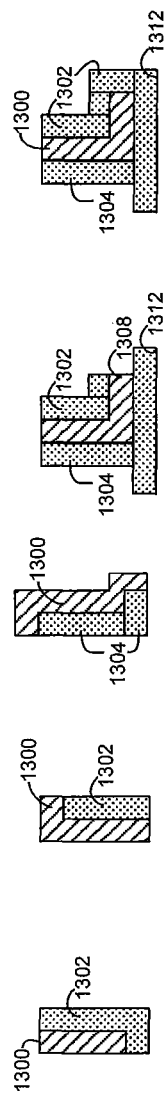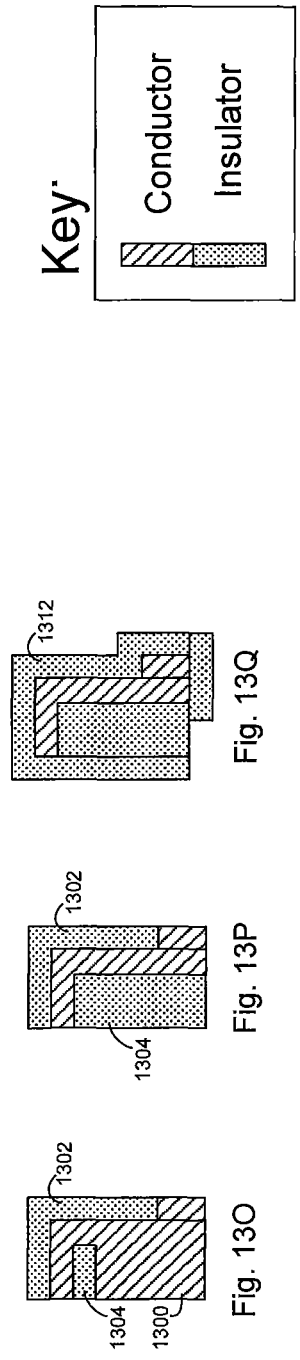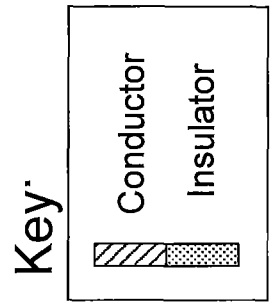

VERTICAL MICROBOLOMETER CONTACT SYSTEMS AND METHODS

CROSS-REFERENCE TO RELATED APPLICATIONS

This application is a divisional of U.S. patent application Ser. No. 15/396,100 filed Dec. 30, 2016 and entitled "VERTICAL MICROBOLOMETER CONTACT SYSTEMS AND METHODS," which is a continuation of International Patent Application No. PCT/US2015/039138 filed Jul. 2, 2015 and entitled "VERTICAL MICROBOLOMETER CONTACT SYSTEMS AND METHODS," which in turn claims priority to and the benefit of U.S. Provisional Patent Application No. 62/020,747 filed on Jul. 3, 2014 and entitled "VERTICAL MICROBOLOMETER CONTACT SYSTEMS AND METHODS," the contents all of which are hereby incorporated by reference in their entirety.

TECHNICAL FIELD

One or more embodiments of the invention relate generally to infrared cameras and, more particularly, to microbolometer contact systems and methods, such as vertical leg contacts for microbolometer focal plane arrays.

BACKGROUND

A microbolometer is an example of a type of infrared detector that may be used within an infrared imaging device (e.g., an infrared camera). For example, the microbolometer is typically fabricated on a monolithic silicon substrate to form an infrared (image) detector array, with each microbolometer of the infrared detector array functioning as a pixel to produce a two-dimensional image. The change in resistance of each microbolometer is translated into a time-multiplexed electrical signal by circuitry known as the read out integrated circuit (ROIC). The combination of the ROIC and the infrared detector array (e.g., microbolometer array) is commonly known as a focal plane array (FPA) or infrared FPA (IRFPA). Additional details regarding FPAs and microbolometers may be found, for example, in U.S. Pat. Nos. 5,756,999, 6,028,309, 6,812,465, and 7,034,301, which are herein incorporated by reference in their entirety.

Each microbolometer in the array is generally coupled to one or more contacts that extend vertically from the array down to the ROIC. The contacts can be used for providing a reference voltage for the microbolometer and/or a signal path from the microbolometer to the ROIC. Microbolometers often include a light-sensitive portion formed from resistive material suspended on a bridge, with the resistive material coupled to its contacts via legs that run from the bridge to the contacts. The legs attach to resistive material through a resistive material contact.

One of the challenges in designing efficient microbolometers is increasing the ratio of the light-sensitive area or the active pixel area to the total area of the array, sometimes referred to as the fill factor of the array. Leg supports for each microbolometer can occupy a significant portion of the array area and can therefore limit the fill factor of the array. It would therefore be desirable to reduce the amount of area occupied by the legs. However, in order to maintain device performance, the width and length of each leg support should scale with the area of each pixel. It can therefore be difficult to reduce the leg area and increase the fill factor. As a result, there is a need for improved techniques for implementing leg supports, such as for microbolometer-based focal plane arrays.

SUMMARY

Systems and methods are disclosed, in accordance with one or more embodiments, which are directed to microbolometer legs for an infrared detector. For example, in accordance with an embodiment of the invention, vertical legs are disclosed, such as for infrared detectors within a focal plane array, that may be more area efficient as compared to conventional legs that extend horizontally substantially in plane with the infrared detector. For one or more embodiments, the leg systems and methods disclosed herein may provide certain advantages over conventional leg approaches, especially as semiconductor processing technologies transition to smaller dimensions.

In accordance with one embodiment, an infrared imaging device includes an array of microbolometers each having a bridge that is coupled to a contact by at least one vertical bolometer leg. The legs and bridges of the microbolometer array may be suspended above a readout integrated circuit for the microbolometer array. The vertical bolometer legs may be formed using spacer deposition and etch processing operations that form at least portions of the vertical bolometer legs on the sidewalls of an opening in a sacrificial layer that is then removed to release the bolometer legs.

According to various embodiments, a vertical bolometer leg may run along a path that is disposed in a plane that is parallel to a plane defined by the bridge of the microbolometer and/or a plane that is defined by a surface of a substrate of the device such as a readout integrated circuit substrate and may have an extended dimension that extends in a direction that is perpendicular to the plane of the path, the substrate surface, and/or the plane of the bridge. In this way, the area of the bolometer leg that would otherwise occupy a relatively larger fraction of the surface area of the microbolometer array can be reduced without reducing the area of the bolometer leg.

According to various embodiments, the leg structure may or may not be encapsulated in an insulating layer such as a silicon dioxide or a silicon nitride. The leg structure may be formed from multiple layers of insulating material to optimize performance. A leg conductive layer may be fully or partially encapsulated with an insulation layer, or may be free of any insulation layer. The leg conductive layer may be a homogeneous film of a single material type or a multilayer conductive layer formed from, for example, several depositions.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 13A through 13Q show various arrangements of a vertical leg, such as for the vertical legs of FIGS. 5A and 5B, in accordance with various embodiments.

Embodiments of the invention and their advantages are best understood by referring to the detailed description that follows. It should be appreciated that like reference numerals are used to identify like elements illustrated in one or more of the figures.

DETAILED DESCRIPTION

Figure 1:
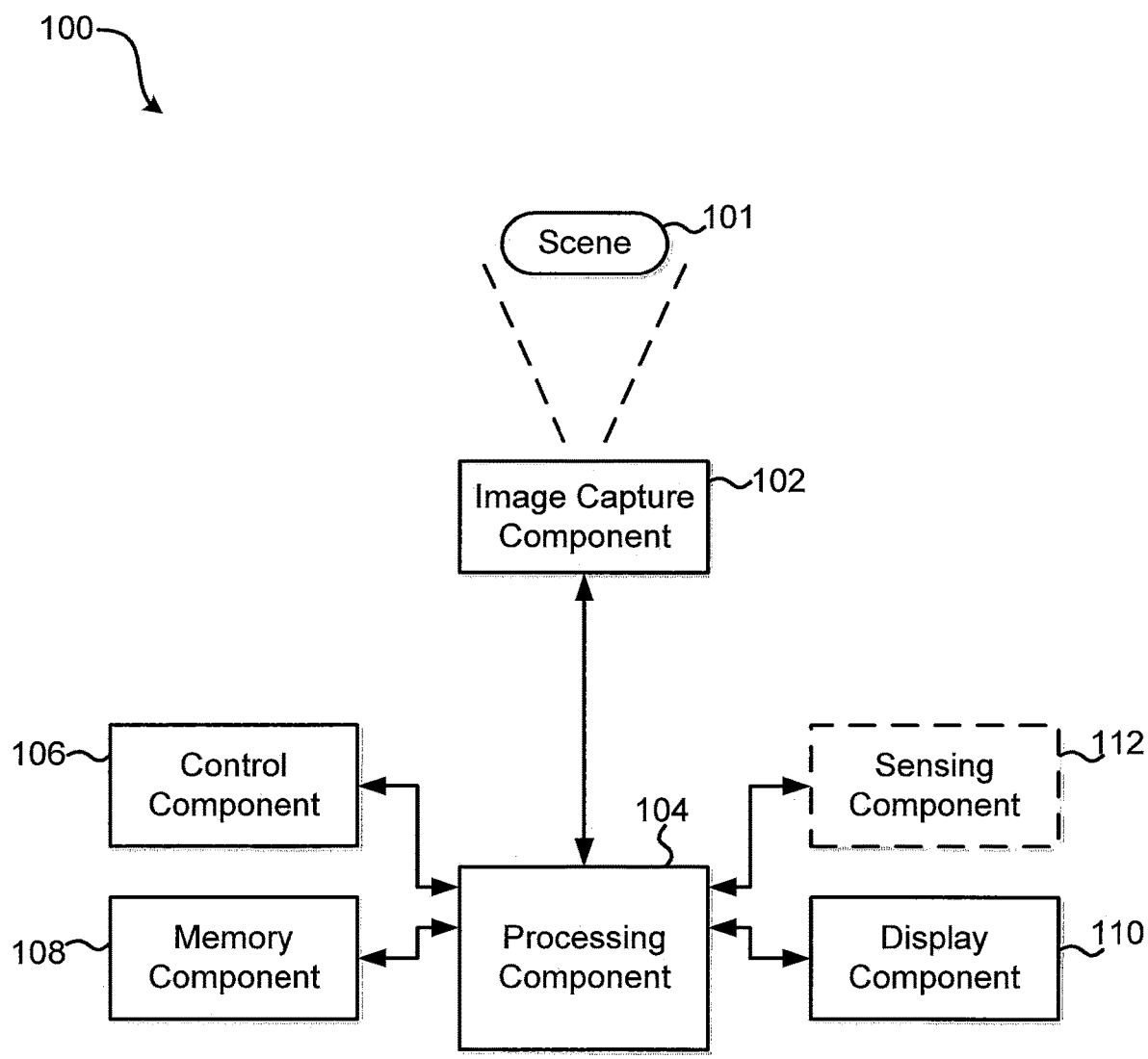
FIG. 1 shows a block diagram illustrating an infrared camera in accordance with one or more embodiments.

Systems and methods are disclosed herein to provide vertically oriented legs for an infrared detector, in accordance with one or more embodiments. For example, in accordance with an embodiment, vertical bolometer legs are disclosed, such as for microbolometers within a focal plane array. As an implementation example, FIG. 1 shows a block diagram illustrating a system 100 (e.g., an infrared camera, including any type of infrared imaging system) for capturing images and processing in accordance with one or more embodiments. System 100 comprises, in one implementation, an image capture component 102, a processing component 104, a control component 106, a memory component 108, and a display component 110. Optionally, system 100 may include a sensing component 112.

System 100 may represent, for example, an infrared imaging device, such as an infrared camera, to capture and process images, such as video images of a scene 101. The system 100 may represent any type of infrared camera that employs infrared detectors having contacts, which may be implemented as disclosed herein. System 100 may comprise a portable device and may be incorporated, e.g., into a vehicle (e.g., an automobile or other type of land-based vehicle, an aircraft, or a spacecraft) or a non-mobile installation requiring infrared images to be stored and/or displayed or may comprise a distributed networked system (e.g., processing component 104 distant from and controlling image capture component 102 via the network).

In various embodiments, processing component 104 may comprise any type of a processor or a logic device (e.g., a programmable logic device (PLD) configured to perform processing functions). Processing component 104 may be adapted to interface and communicate with components 102, 106, 108, and 110 to perform method and processing steps and/or operations, such as for example, controlling biasing and other functions (e.g., values for elements such as variable resistors and current sources, switch settings for biasing and timing, and other parameters) along with other conventional system processing functions as would be understood by one skilled in the art.

Memory component 108 comprises, in one embodiment, one or more memory devices adapted to store data and information, including for example infrared data and information. Memory device 108 may comprise one or more various types of memory devices including volatile and non-volatile memory devices, including computer-readable medium (portable or fixed). Processing component 104 may be adapted to execute software stored in memory component 108 so as to perform method and process steps and/or operations described herein.

Image capture component 102 comprises, in one embodiment, one or more infrared sensors (e.g., any type of multi-pixel infrared detector, such as a focal plane array having one or more vertical legs as disclosed herein) for capturing infrared image data (e.g., still image data and/or video data) representative of an image, such as scene 101. In one implementation, the infrared sensors of image capture component 102 provide for representing (e.g., converting) the captured image data as digital data (e.g., via an analog-to-digital converter included as part of the infrared sensor or separate from the infrared sensor as part of system 100). In one or more embodiments, image capture component 102 may further represent or include a lens, a shutter, and/or other associated components along with the vacuum package assembly for capturing infrared image data. Image capture component 102 may further include temperature sensors (or temperature sensors may be distributed within system 100) to provide temperature information to processing component 104 as to operating temperature of image capture component 102.

In one aspect, the infrared image data (e.g., infrared video data) may comprise non-uniform data (e.g., real image data) of an image, such as scene 101. Processing component 104 may be adapted to process the infrared image data (e.g., to provide processed image data), store the infrared image data in memory component 108, and/or retrieve stored infrared image data from memory component 108. For example, processing component 104 may be adapted to process infrared image data stored in memory component 108 to provide processed image data and information (e.g., captured and/or processed infrared image data).

Control component 106 comprises, in one embodiment, a user input and/or interface device, such as a rotatable knob (e.g., potentiometer), push buttons, slide bar, keyboard, etc., that is adapted to generate a user input control signal. Processing component 104 may be adapted to sense control input signals from a user via control component 106 and respond to any sensed control input signals received therefrom. Processing component 104 may be adapted to interpret such a control input signal as a parameter value, as generally understood by one skilled in the art. In one embodiment, control component 106 may comprise a control unit (e.g., a wired or wireless handheld control unit) having push buttons adapted to interface with a user and receive user input control values. In one implementation, the push buttons of the control unit may be used to control various functions of the system 100, such as autofocus, menu enable and selection, field of view, brightness, contrast, noise filtering, high pass filtering, low pass filtering, and/or various other features as understood by one skilled in the art.

Display component 110 comprises, in one embodiment, an image display device (e.g., a liquid crystal display (LCD) or various other types of generally known video displays or monitors). Processing component 104 may be adapted to display image data and information on the display component 110. Processing component 104 may be adapted to retrieve image data and information from memory component 108 and display any retrieved image data and information on display component 110. Display component 110 may comprise display electronics, which may be utilized by processing component 104 to display image data and information (e.g., infrared images). Display component 110 may be adapted to receive image data and information directly from image capture component 102 via the processing component 104, or the image data and information may be transferred from memory component 108 via processing component 104.

Optional sensing component 112 comprises, in one embodiment, one or more sensors of various types, depending on the application or implementation requirements, as would be understood by one skilled in the art. The sensors of optional sensing component 112 provide data and/or information to at least processing component 104. In one aspect, processing component 104 may be adapted to communicate with sensing component 112 (e.g., by receiving sensor information from sensing component 112) and with image capture component 102 (e.g., by receiving data and information from image capture component 102 and providing and/or receiving command, control, and/or other information to and/or from one or more other components of system 100).

In various implementations, sensing component 112 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 112 may represent conventional sensors as generally known by one skilled in the art for monitoring various conditions (e.g., environmental conditions) that may have an effect (e.g., on the image appearance) on the data provided by image capture component 102.

In some implementations, optional sensing component 112 (e.g., one or more of sensors) may comprise devices that relay information to processing component 104 via wired and/or wireless communication. For example, optional sensing component 112 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In various embodiments, components of system 100 may be combined and/or implemented or not, as desired or depending on the application or requirements, with system 100 representing various functional blocks of a related system. In one example, processing component 104 may be combined with memory component 108, image capture component 102, display component 110, and/or optional sensing component 112. In another example, processing component 104 may be combined with image capture component 102 with only certain functions of processing component 104 performed by circuitry (e.g., a processor, a microprocessor, a logic device, a microcontroller, etc.) within image capture component 102. Furthermore, various components of system 100 may be remote from each other (e.g., image capture component 102 may comprise a remote sensor with processing component 104, etc. representing a computer that may or may not be in communication with image capture component 102).

Figure 2:
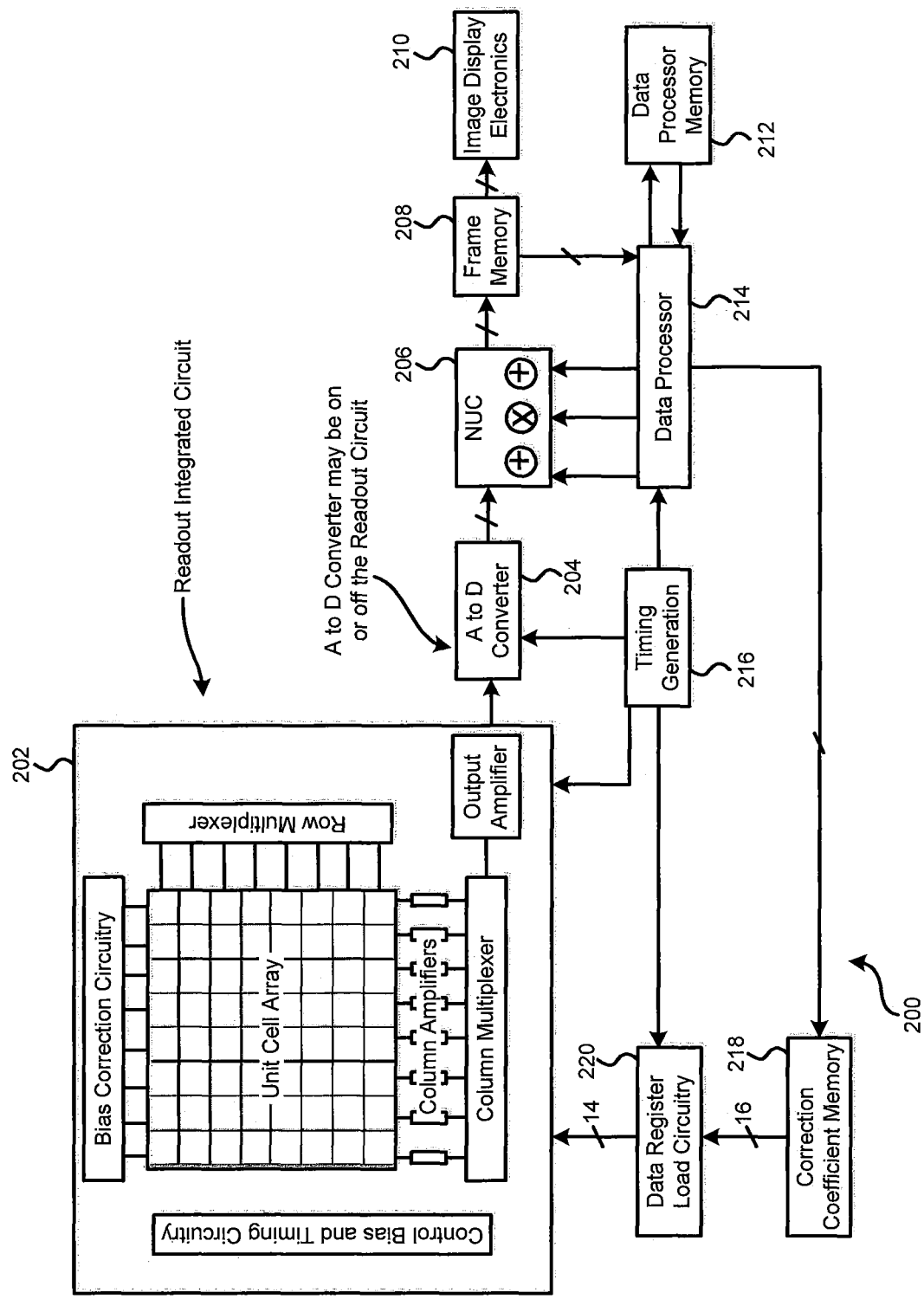
FIG. 2 shows a block diagram illustrating an implementation example for an infrared camera in accordance with one or more embodiments.

FIG. 2 shows a block diagram illustrating a specific implementation example for an infrared camera 200 in accordance with one or more embodiments. Infrared camera 200 may represent a specific implementation of system 100 (FIG. 1), as would be understood by one skilled in the art.

Infrared camera 200 (e.g., a microbolometer readout integrated circuit with bias-correction circuitry and interface system electronics) includes a readout integrated circuit (ROIC) 202, which may include the microbolometer unit cell array having one or more contacts coupled to microbolometer bridges via vertical legs as disclosed herein, control circuitry, timing circuitry, bias circuitry, row and column addressing circuitry, column amplifiers, and associated electronics to provide output signals that are digitized by an analog-to-digital (A/D) converter 204. The A/D converter 204 may be located as part of or separate from ROIC 202.

The output signals from A/D converter 204 are adjusted by a non-uniformity correction circuit (NUC) 206, which applies temperature dependent compensation as would be understood by one skilled in the art. After processing by NUC 206, the output signals are stored in a frame memory 208. The data in frame memory 208 is then available to image display electronics 210 and a data processor 214, which may also have a data processor memory 212. A timing generator 216 provides system timing.

Data processor 214 generates bias-correction data words, which are loaded into a correction coefficient memory 218. A data register load circuit 220 provides the interface to load the correction data into ROIC 202. In this fashion, variable circuitry such as variable resistors, digital-to-analog converters, biasing circuitry, which control voltage levels, biasing, frame timing, circuit element values, etc., are controlled by data processor 214 so that the output signals from ROIC 202 are uniform over a wide temperature range.

It should be understood that various functional blocks of infrared camera 200 may be combined and various functional blocks may also not be necessary, depending upon a specific application and specific requirements. For example, data processor 214 may perform various functions of NUC 206, while various memory blocks, such as correction coefficient memory 218 and frame memory 208, may be combined as desired.

Figure 3:
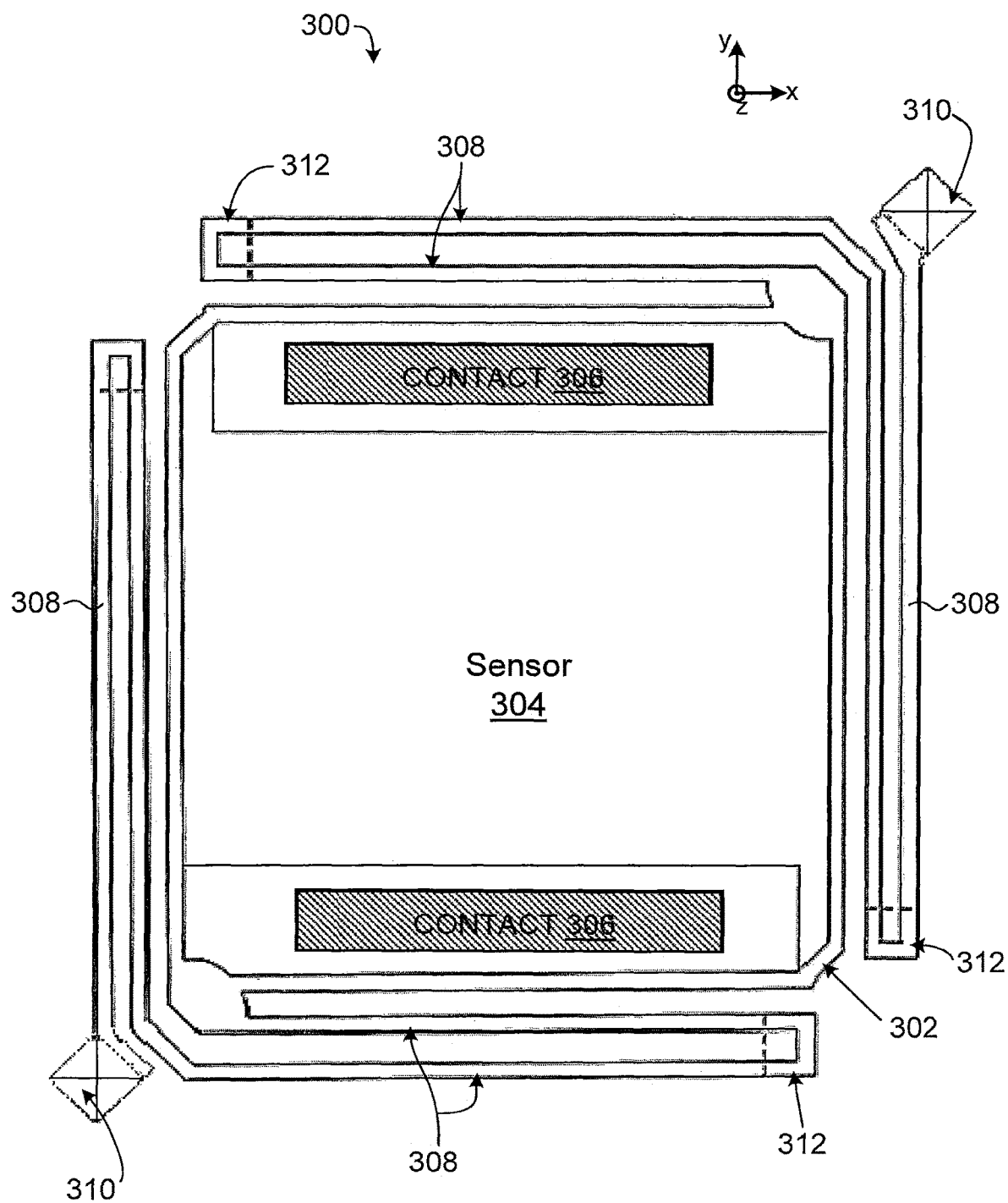
FIG. 3 shows a physical layout diagram of a microbolometer of a microbolometer array having vertical legs in accordance with an embodiment.

FIG. 3 shows a physical layout diagram of a microbolometer 300 in accordance with an embodiment of the invention. Microbolometer 300 includes a bridge portion 302 having a light sensor 304 and bridge contacts 306 that couple sensor 304 to a first end of legs 308. Legs 308 each couple sensor 304 to one of contacts 310.

Each contact 310 may couple one or more associated microbolometers 300 to associated readout circuitry of a readout integrated circuit (ROIC, not shown). For example, a first contact 310 may be used to provide a reference or bias voltage to the microbolometer and a second contact 310 may be used to a signal path from the microbolometer to the ROIC by which signals corresponding to infrared light absorbed by the microbolometer can be readout. Further descriptions of ROIC and microbolometer circuits may be found in U.S. Pat. No. 6,028,309, which is incorporated by reference in its entirety herein for all purposes.

Sensor 304 may be arranged to convert incident light such as infrared light into detectable electrical signals based on changes in electrical properties of the sensor (e.g., changes in resistivity) due to changes in temperature of the sensor when the light is incident. According to an embodiment, sensor 304 may include a resistive material, which may be formed of a high temperature coefficient of resistivity (TCR) material (e.g., vanadium oxide (VOx) or amorphous silicon).

The resistive material may be suspended above the ROIC on bridge 302 and coupled to its contacts 310 via legs 308.

According to various embodiments, each contact 310 may be attached to a portion of a leg 308 that bends downward toward the ROIC (e.g., contact 310 may be formed on a substrate such as the ROIC and leg 308 may include a portion that runs at a non-perpendicular angle to the substrate from a first height above the substrate such as the height of the bridge downward to the substrate contact) and/or each contact 310 may include a portion that extends downward (e.g., in the negative z-direction of FIG. 3) from leg 308 to the surface of the ROIC. Legs 308 may be formed from one or more layers of conductive material such as, for example, titanium, nickel chromium, and/or other suitable conductive materials.

In order to provide legs 308 having a width and a length that is sufficient to provide suitable performance for microbolometer 300 without reducing the fill-factor of an array of microbolometers in which microbolometer 300 is included, legs 308 may be vertically oriented legs that run along paths in and/or parallel to the x-y plane of FIG. 3 as shown and have an extended dimension that extends in a direction parallel to the z-direction of FIG. 3. Legs 308 may include bend portions 312. Bend portions 312 may have additional electrical coupling and/or support structures as described in further detail hereinafter.

A plane such as the x-y plane of FIG. 3 may be defined by the bridge of the microbolometer (e.g., the bridge may include a planar sensor layer such as a resistive layer that defines a plane or a plane may be defined that passes through multiple bridges in a microbolometer array) or by the surface of a substrate (e.g., an ROIC substrate) to which the microbolometer array is coupled and disposed above.

Figure 4A:
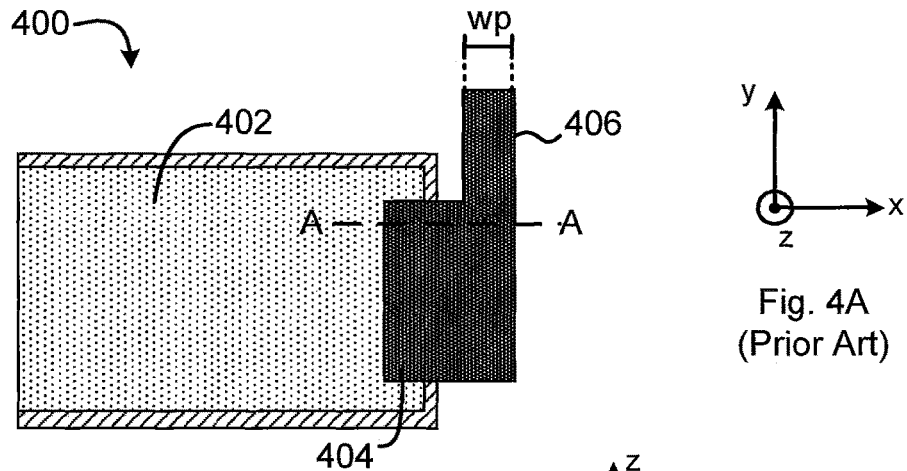
FIGS. 4A and 4B show a top view and a cross-sectional side view respectively of a conventional horizontal leg for a microbolometer.
Figure 4B:
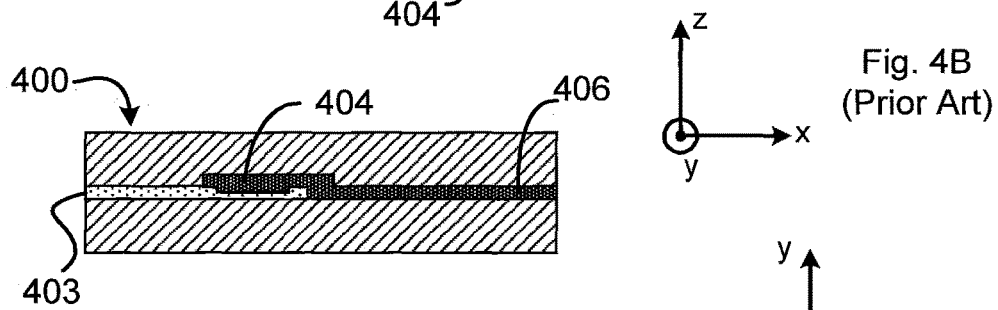

FIGS. 4A and 4B respectively show top and cross-sectional views of a conventional microbolometer 400 having horizontally oriented legs 406. As shown in the top view of FIG. 4A, a bridge 402 of microbolometer 400 is connected by a bridge contact 404 to horizontally oriented leg 406 having an extended dimension of width WP that extends in the x-y plane of FIG. 4A. In the cross sectional view of FIG. 4B, taken along line A-A of FIG. 4A, it can more easily be seen that contact 404, leg 406, and resistive material 403 of microbolometer 400 all extend along the same plane or parallel planes that are parallel to the x-y plane of FIG. 4B.

Figure 5A:
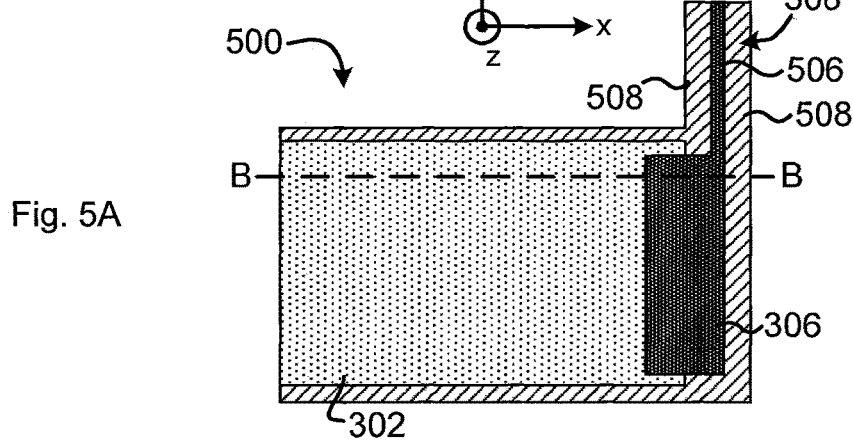
FIGS. 5A and 5B show a top view and a cross-sectional side view respectively of a vertical leg such as for a leg for coupling an infrared detector element to a contact, in accordance with an embodiment.
Figure 5B:
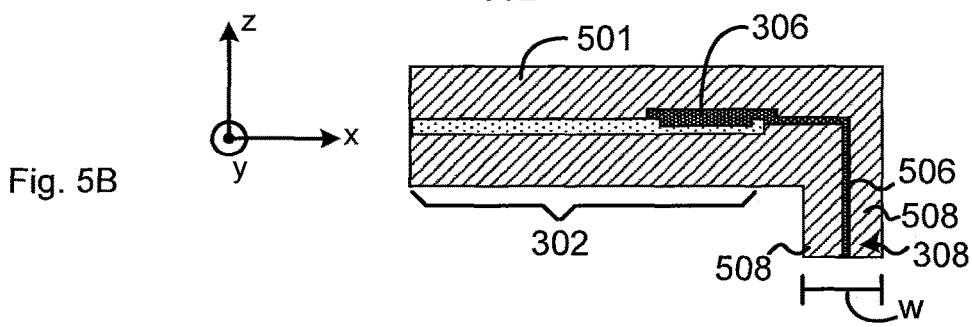

In contrast, FIGS. 5A and 5B respectively show top and cross-sectional views of a microbolometer 500 according to an embodiment of the present disclosure that includes a vertically oriented leg 308. As shown, vertically oriented leg 308 may have a width W in the x-y plane of FIGS. 5A and 5B. Width W may be comparatively smaller than the width WP of a conventional microbolometer leg without sacrificing the overall volume of the leg by allowing the leg 308 to extend in the vertical direction (e.g., in a direction parallel to the z-direction of FIGS. 5A and 5B) so that vertical leg 308 is perpendicular to a plane defined by bridge 302 (e.g., by resistive material 501 of bridge 302, by bridge contact 306, and or by an array of bolometer bridges formed at a common height above an ROIC) and/or a plane defined by a surface of the substrate over which the bridge is formed.

As shown, according to an embodiment, a vertical leg 308 may include a conductive (e.g., metal) portion 506 and, if desired, insulating material 508 on one or more sides of the conductive portion. However, this is merely illustrative. According to various embodiments, conductive portion 506 may be partially or completely surrounded by dielectric material or may be free of dielectric material. Various examples of implementations of vertical legs 308 are described hereinafter in connection with FIGS. 13A-13Q. However, first, processes that may be used to form vertical bolometer legs such as vertical legs 308 of FIGS. 3, 5A, and 5B will be discussed according to various embodiments.

FIGS. 6A-6F show cross sectional side views of a portion of a microbolometer array at various stages during production of microbolometer legs for the microbolometer array.

Figure 6A:
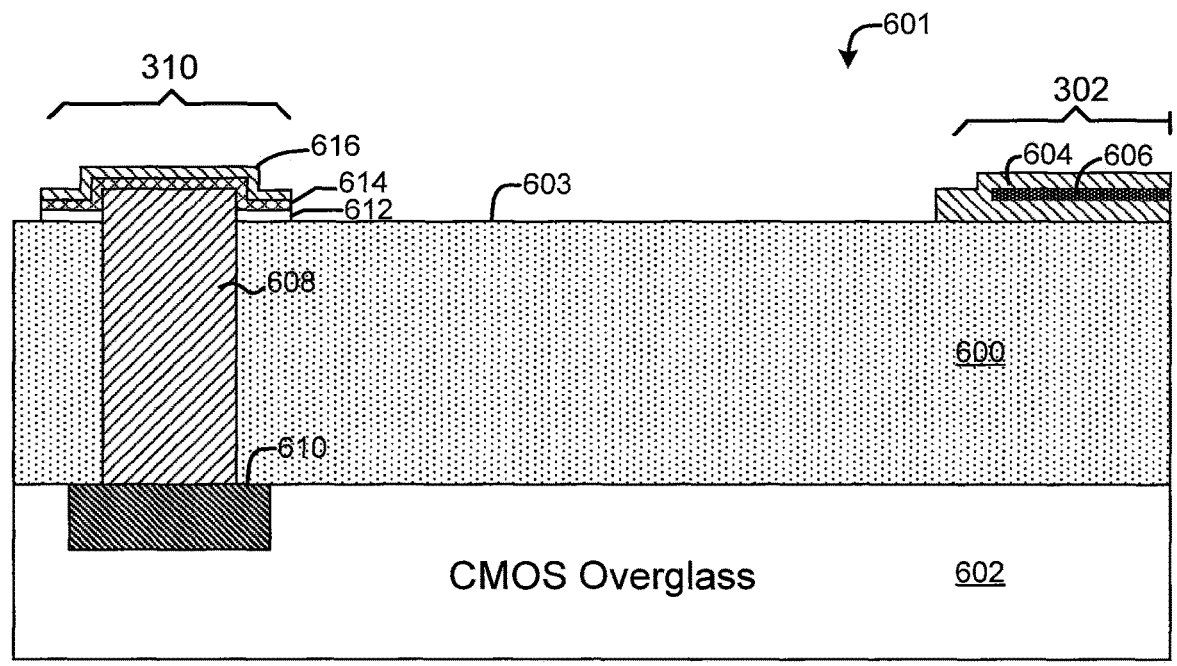
FIGS. 6A through 6F illustrate a processing overview for manufacturing a vertical leg, such as for the vertical legs of FIG. 3, in accordance with an embodiment.

Turning now to FIG. 6A, a portion 601 of a microbolometer array is shown having a contact 310 and a bridge 302. As shown, bridge 302 includes a sensor layer (e.g., a layer of temperature sensitive resistive material such as VOx) 606 and one or more additional layers 604 such as absorber layers. As shown, contact 310 may be formed from a vertical conductive portion such as metal stud 608 and one or more layers such as a metal contact layer 614 in contact with metal stud 608. Contact 310 may include additional layers such as a dielectric layer 616 disposed over the metal layer 614 and an additional layer 612 such as a passivation layer disposed under portions of metal layer 614. As shown, layer 612 may be formed on a portion of a top surface 603 of a sacrificial layer 600.

Sacrificial layer 600 may be formed from, for example, polyimide. Layers 612 and 616 may be formed from, as examples, silicon dioxide or silicon nitride. Metal layer 614 may be formed from titanium, tungsten, copper, aluminum and/or other known metals.

Metal stud 608 may be conductively coupled to a conductive contact such as contact 610 of a substrate such as a readout integrated circuit (ROIC) substrate such as a complementary metal-oxide-semiconductor (CMOS) ROIC. In the example of FIG. 6A, contact 610 is disposed in an overglass layer 602 (e.g., a CMOS overglass layer) of the ROIC. Prior to forming vertical legs between the bridge 302 and the contact 310, bridge 302 may be disposed on a sacrificial layer 600 that supports bridge 302 and fills a gap between bridges of the microbolometer array and the ROIC and runs continuously between the bridges and contacts of the microbolometer array.

Figure 6B:
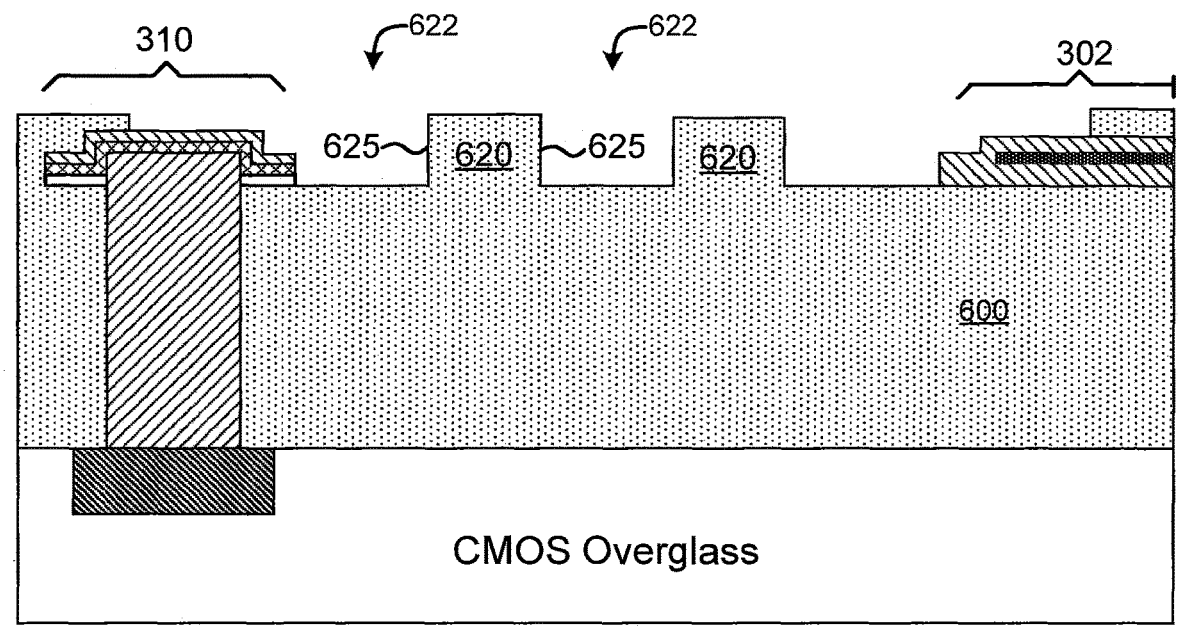

According to one embodiment, a process for forming vertical legs between bridge 302 and contact 310 may include depositing and patterning an additional sacrificial layer 620 on sacrificial layer 600 as shown in FIG. 6B. Patterning the additional sacrificial layer 620 may include forming openings 622 in the additional sacrificial layer (e.g., at least partially between the bridge 302 and the contact 310) so that remaining portions of additional sacrificial layer 620 have vertical sidewalls 625. Openings 622 may extend into sacrificial layer 600 or may extend only to the top surface 603 of sacrificial layer 600 (as examples).

Figure 6C:
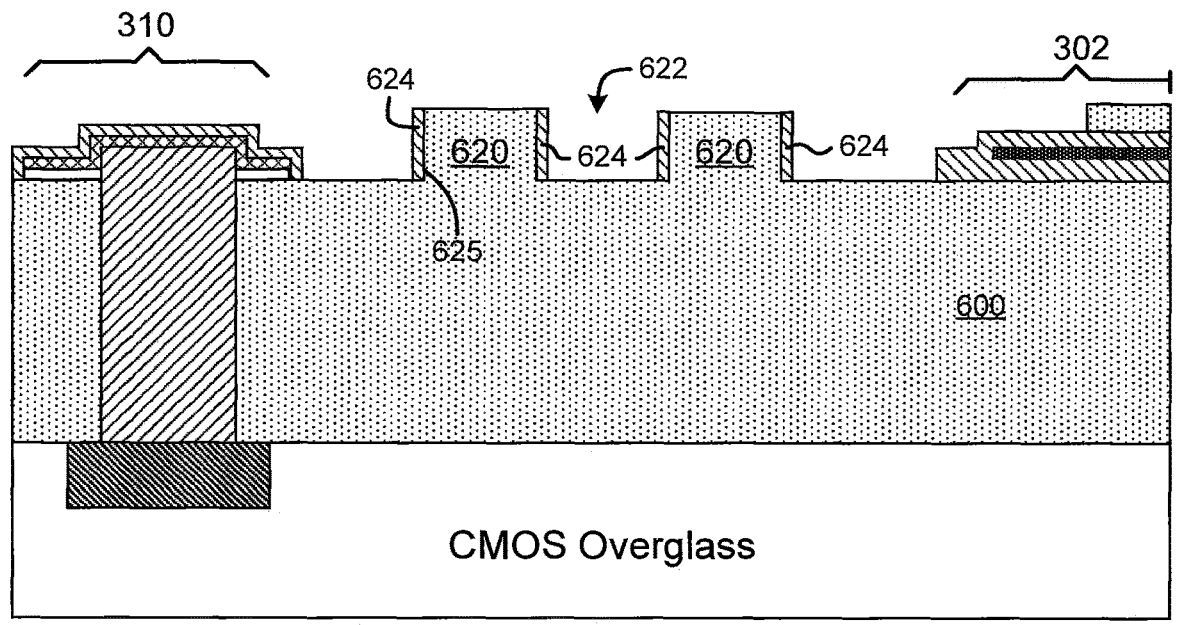
Figure 6D:
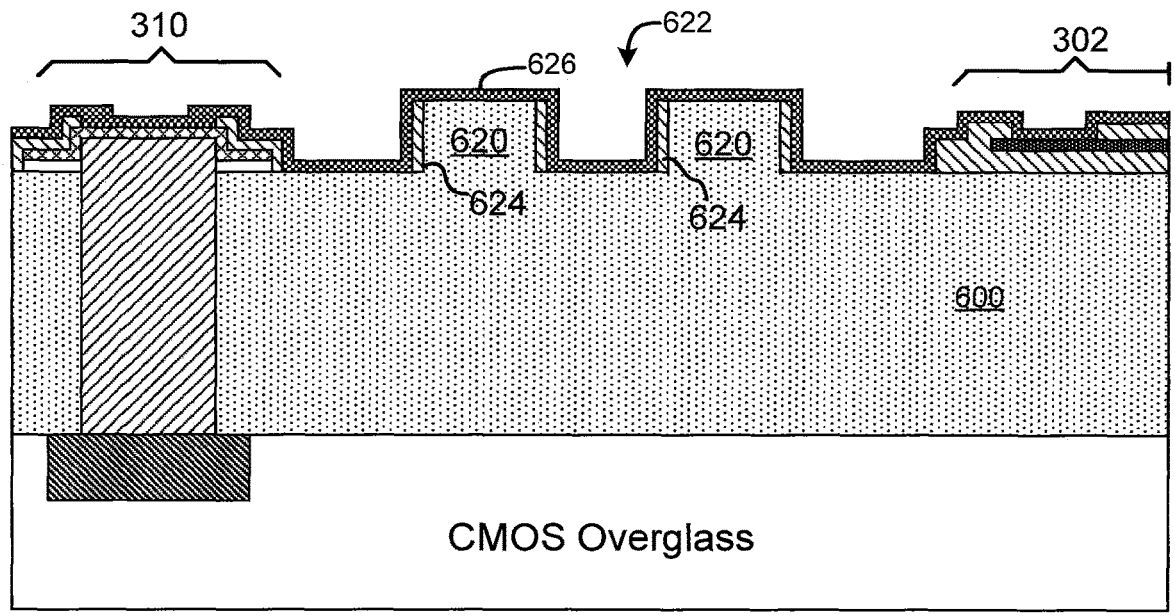

Following the deposition and patterning of additional sacrificial layer 620, a dielectric layer 624 may be deposited and patterned so that portions of the dielectric layer 624 remain on sidewalls 625 of additional sacrificial layer 620 in openings 622 as shown in FIG. 6C. A metal layer such as a leg metal layer 626 may then be deposited over contact 310, portions of sacrificial layer 600, dielectric layer 624 on sidewalls 625, portions of additional sacrificial layer 620, and bridge 302 as shown in FIG. 6D. If desired, openings may be formed in a dielectric layer of contact 310 and bridge 302 to expose portions of metal layer 614 and sensor layer 606 so that metal layer 626 can be deposited in contact with metal layer 614 and sensor layer 606. Metal layer 626 may be deposited in a blanket deposition process.

Figure 6E:
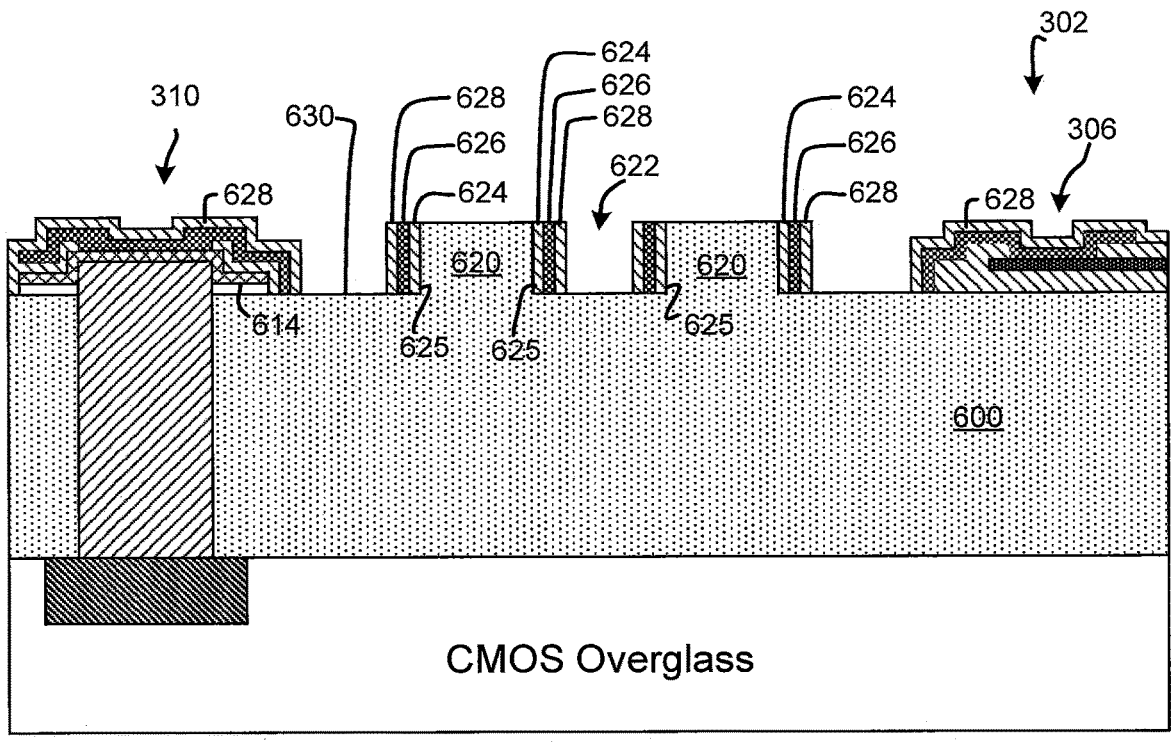

As shown in FIG. 6E, an additional dielectric layer 628 may be deposited over metal layer 626 and then metal layer 626 and additional dielectric layer 628 may be etched (e.g., in a masked spacer etch process) to remove portions of metal layer 626 and additional dielectric layer 628 from sacrificial layer 600 and additional sacrificial layer 620. In this way, a dielectric-metal-dielectric stack may be formed vertically on sidewalls 625 of openings 622. Portions of the dielectric-metal-dielectric stack that are continuously coupled with the portions on sidewalls 625 may also remain on contact 310 and bridge 302, thereby forming bridge contact 306 and a leg metal contact with metal layer 614 of contact 310.

Dielectric layers 624 and 628 may be formed from, as examples, silicon dioxide or a silicon nitride. Metal layer 626 may be a single metal layer formed form a homogeneous film of a single material or may include multiple materials (e.g., multiple layers of the same or different materials formed in multiple deposition operations). For example, metal layer 626 may be formed from titanium, tungsten, copper, aluminum and/or other known metals.

Figure 6F:
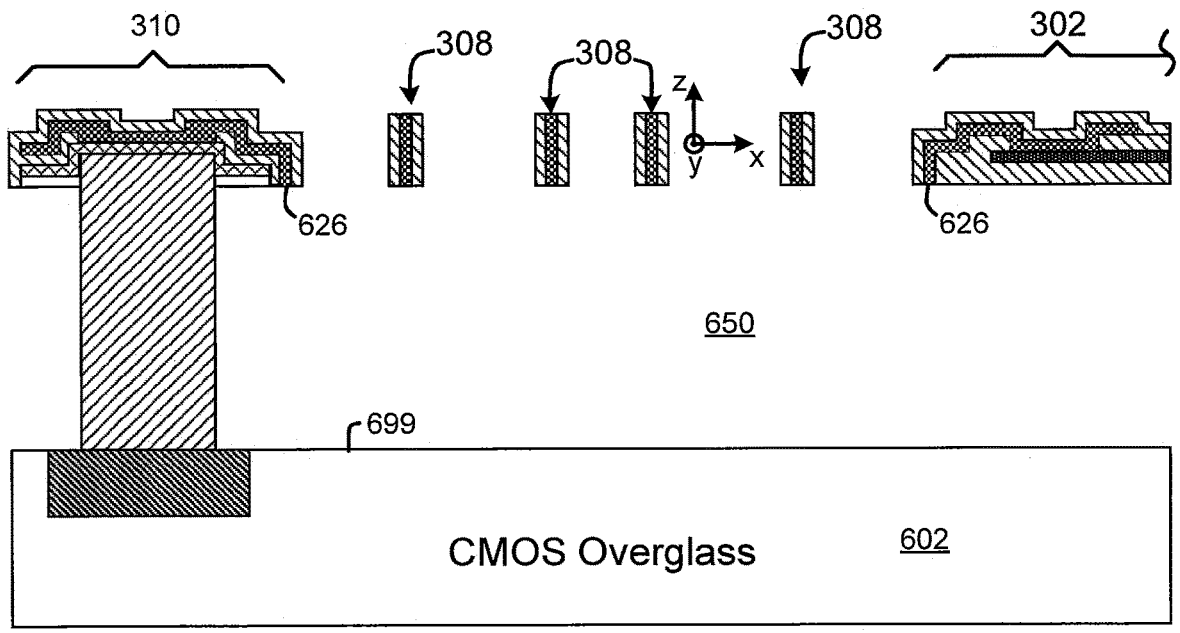

As shown in FIG. 6F, sacrificial layers 600 and 620 may then be removed to release bridge 302 and vertical legs 308 which remain suspended above the ROIC with a space 650 interposed between the vertical legs and the ROIC. Although the vertical legs 308 of FIG. 6F appear to be floating, this is merely because of the particular cross section through the device that is shown. It will be understood by one skilled in the art that vertical legs 308 of FIG. 6F run along the x-y plane of FIG. 6F as, for example, illustrated in FIG. 3 so that metal layer 626 forms a continuous conductive path between bridge contact 306 and contact 310. Vertical legs 308 of FIG. 6F may include at least a portion that runs non-perpendicularly to a plane defined by the surface 699 of substrate 602. For example, vertical legs 308 may run along a path that is parallel to the surface 699. In another example, vertical legs 308 may run along a path that includes a portion that is parallel to surface 699 and an additional portion that bends downward toward surface 699 at a non-perpendicular angle.

The process illustrated by FIGS. 6A-6F is merely illustrative. According to various embodiments, vertical legs for a microbolometer array may be formed using other processes. For example, in one embodiment, a process such as the process shown in FIGS. 7A-7F may be performed to form vertical legs that are disposed below the plane at which bridge 302 is formed (e.g., in contrast with the vertical legs of FIG. 6F that are disposed substantially in a common plane with bridge 302).

Figure 7A:
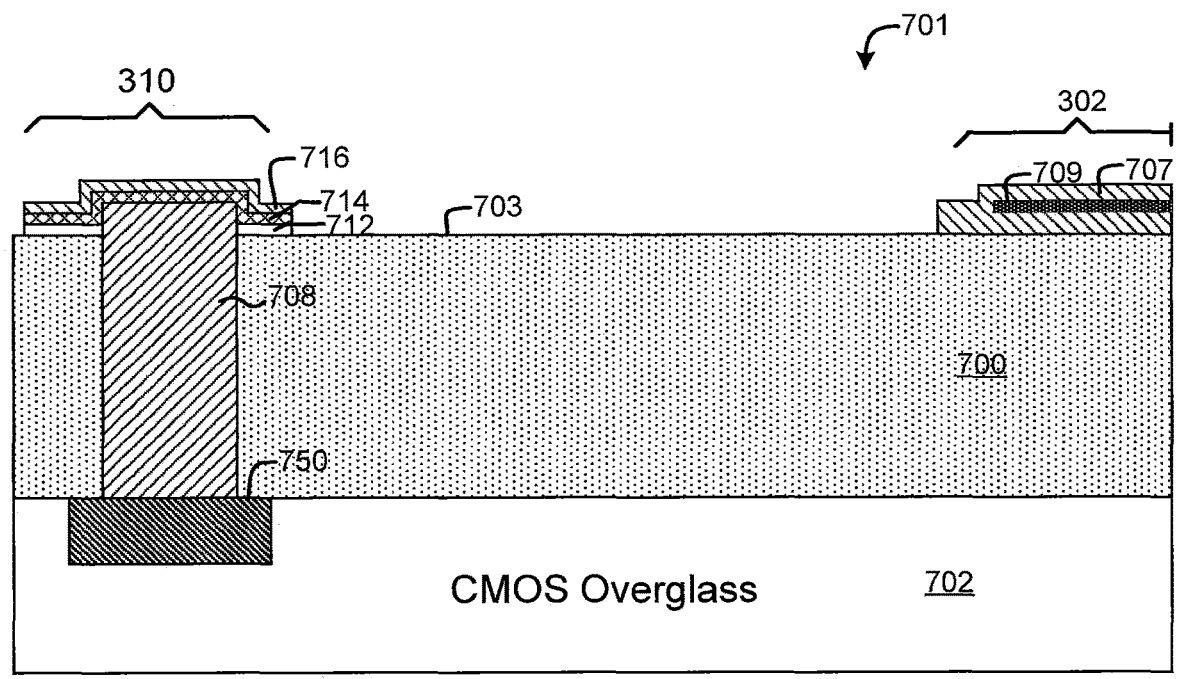
FIGS. 7A through 7F illustrate another processing overview for manufacturing a vertical leg, such as for the vertical legs of FIG. 3, in accordance with an embodiment.

Turning now to FIG. 7A, a portion 701 of a microbolometer array is shown having a contact 310 and a bridge 302. As shown, bridge 302 includes a sensor layer (e.g., a layer of temperature sensitive resistive material such as VOx) 709 and one or more additional layers 707 such as absorber layers. As shown, contact 310 may be formed from a vertical conductive portion such as metal stud 708 and one or more layers such as a metal contact layer 714 in contact with metal stud 708. Contact 310 may include additional layers such as a dielectric layer 716 disposed over the metal layer 714 and an additional layer 712 such as a passivation layer disposed under portions of metal layer 714. As shown, passivation layer 712 may be formed on a portion of a top surface 703 of a sacrificial layer 700.

Sacrificial layer 700 may be formed from, for example, polyimide. Layers 712 and 716 may be formed from, as examples, silicon dioxide or silicon nitride. Metal layer 714 may be formed from titanium, tungsten, copper, aluminum and/or other known metals.

Metal stud 708 may be conductively coupled to a conductive contact such as contact 750 of a readout integrated circuit (ROIC) such as a complementary metal-oxide-semiconductor (CMOS) ROIC. In the example of FIG. 7A, contact 750 is disposed in an overglass layer 702 (e.g., a CMOS overglass layer) of the ROIC. Prior to forming vertical legs between the bridge 302 and the contact 310, bridge 302 may be disposed on a sacrificial layer 700 that supports bridge 302 and fills a gap between bridges of the microbolometer array and the ROIC and runs continuously between the bridges and contacts of the microbolometer array.

Figure 7B:
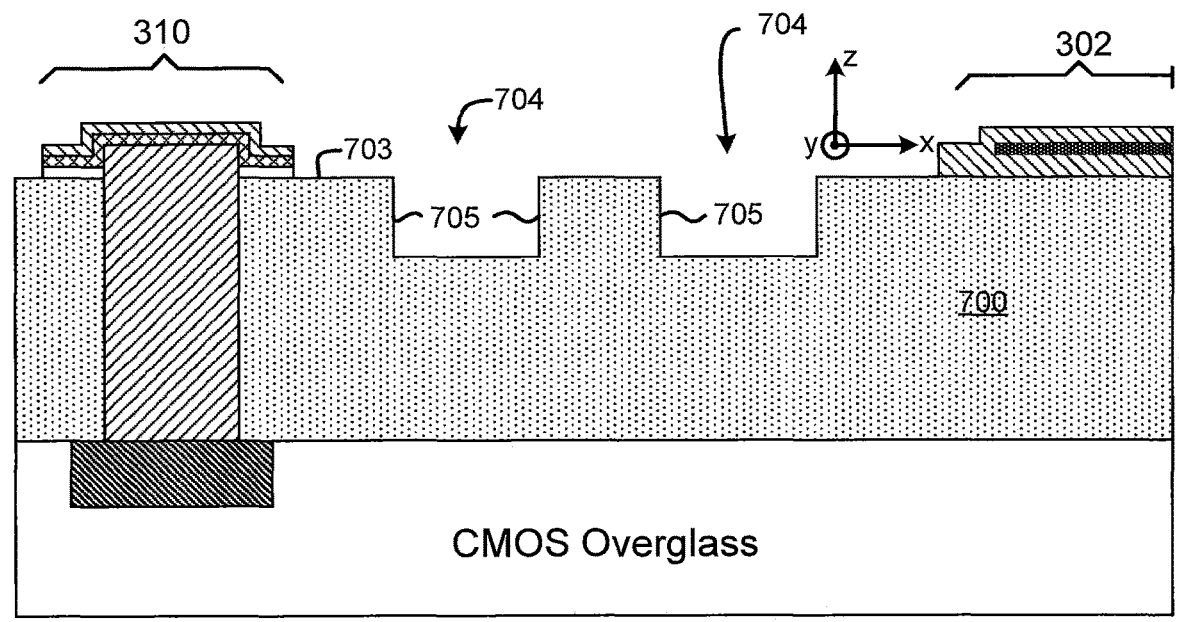

According to one embodiment, a process for forming vertical legs between bridge 302 and contact 310 may include forming openings 704 in the sacrificial layer 700 that supports bridge 302 (e.g., by etching through surface 703) as shown in FIG. 7B. Openings 704 may be formed in a portion of sacrificial layer 700 that is disposed at least partially between the bridge 302 and the contact 310 so that openings 704 have vertical sidewalls 705 at various locations between bridge 302 and contact 310. As shown, sidewalls 705 may be located substantially below a plane defined by bridge 302 (e.g., the x-y plane of FIG. 7B).

Figure 7C:
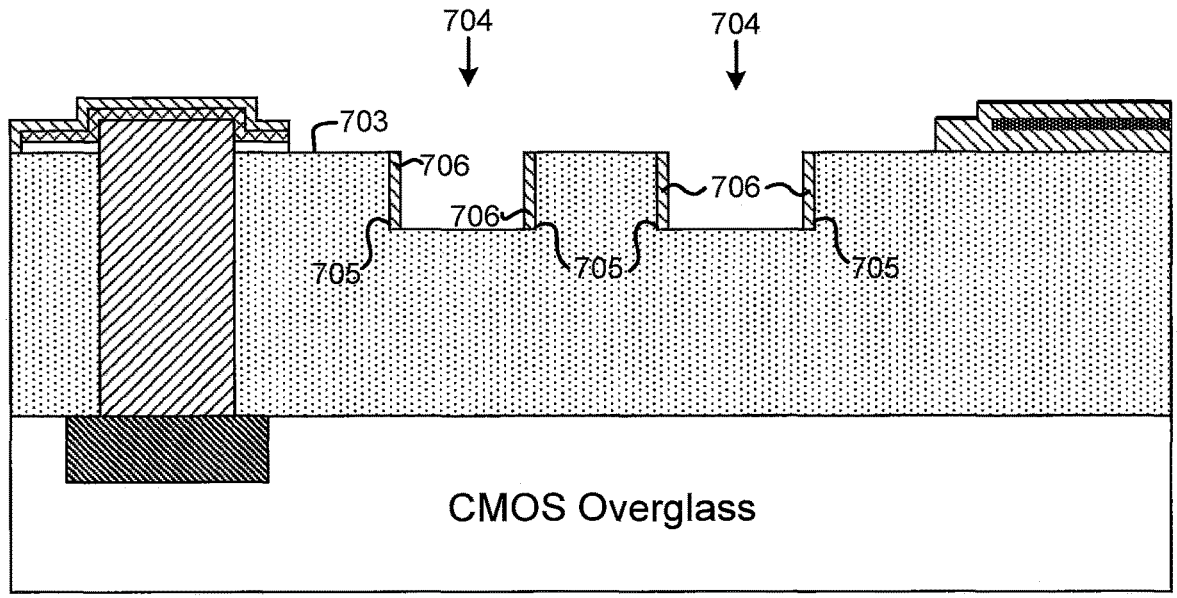
Figure 7D:
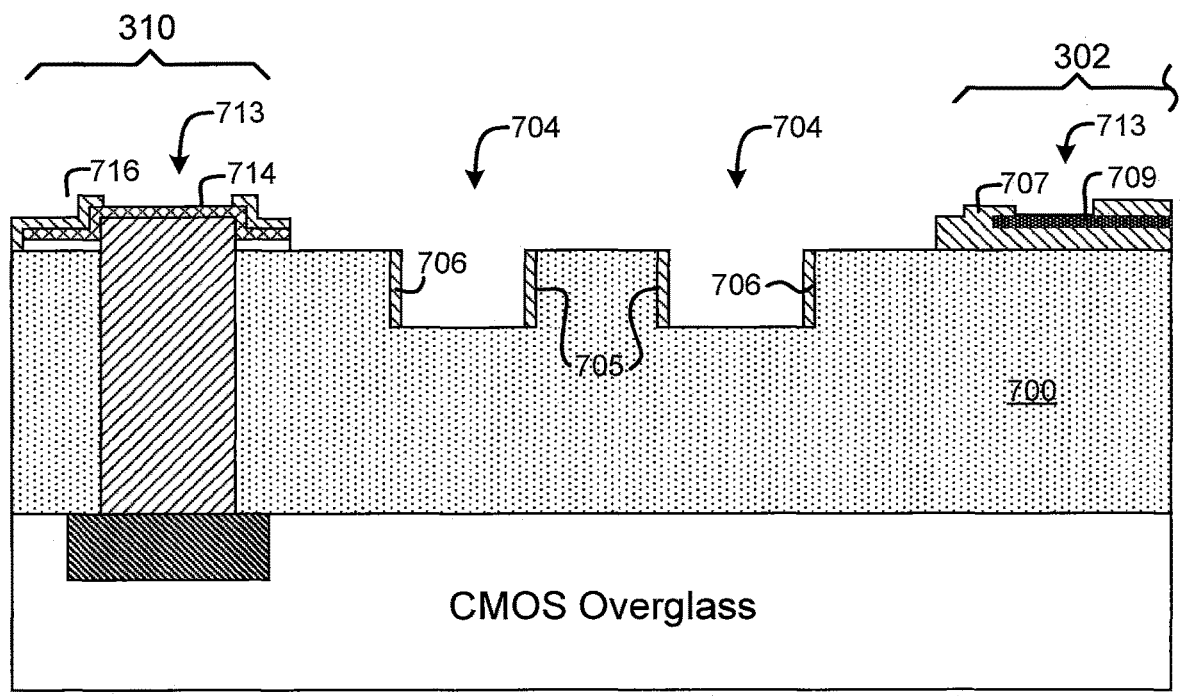

As shown in FIG. 7C, a dielectric layer 706 may be deposited and patterned so that portions of the dielectric layer 706 remain on sidewalls 705 of sacrificial layer 700 in openings 704. Openings such as openings 713 in layers 707 of bridge 302 and dielectric layer 716 may also be formed to expose portions of sensor layer 709 and metal layer 714 respectively as shown in FIG. 7D.

Figure 7E:
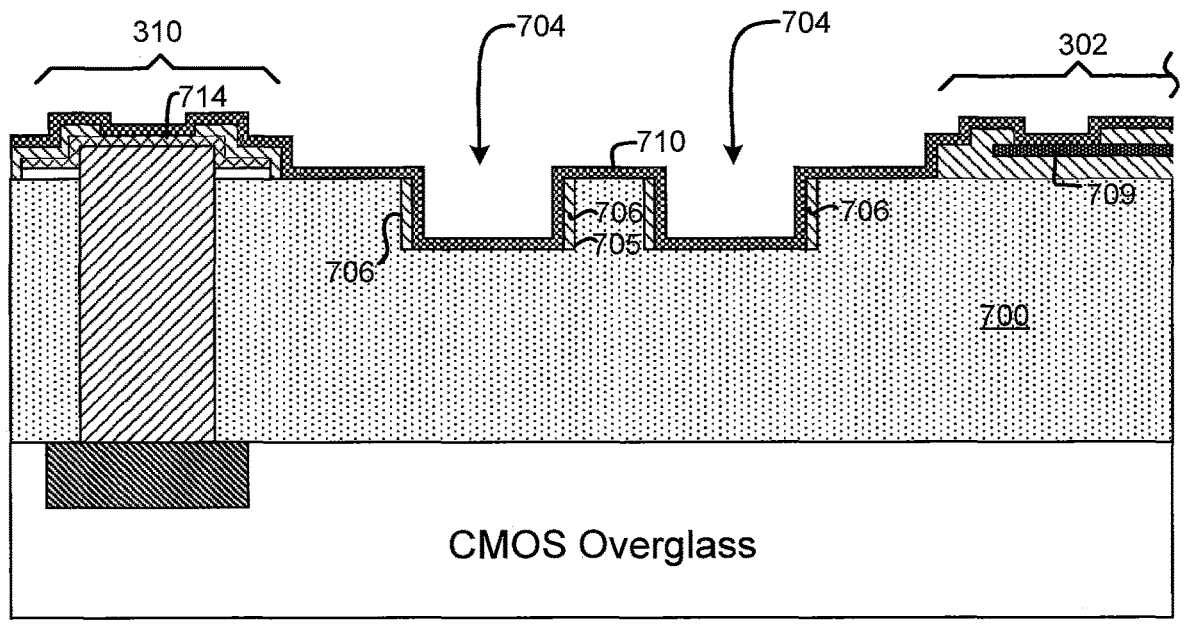

A metal layer such as a leg metal layer 710 may then be deposited over contact 310, portions of sacrificial layer 700, dielectric layer 706 on sidewalls 705, and bridge 302 as shown in FIG. 7E. Metal layer 710 may be deposited in a blanket deposition process. As shown, portions of metal layer 710 may be formed within openings 713 (see FIG. 7D) and in contact with sensor layer 709 and metal layer 714.

An additional dielectric layer 711 (FIG. 7F) may be deposited over metal layer 710 and metal layer 710 and additional dielectric layer 711 may be etched (e.g., in a masked spacer etch process) to remove portions of metal layer 710 and additional dielectric layer 711 from sacrificial layer 700. In this way, a dielectric-metal-dielectric stack may be formed vertically on sidewalls 705 of openings 704 and portions of the dielectric-metal-dielectric stack that are continuously coupled with the portions on sidewalls 705 may also remain on contact 310 and bridge 302, thereby forming bridge contact 306 and a leg metal contact with metal layer 714 of contact 310.

Dielectric layers 706 and 711 may be formed from, as examples, silicon dioxide or a silicon nitride. Metal layer 710 may be a single metal layer formed form a homogeneous film of a single material or may include multiple materials (e.g., multiple layers of the same or different materials formed in multiple deposition operations). For example, metal layer 710 may be formed from titanium, tungsten, copper, aluminum and/or other known metals.

Figure 7F:
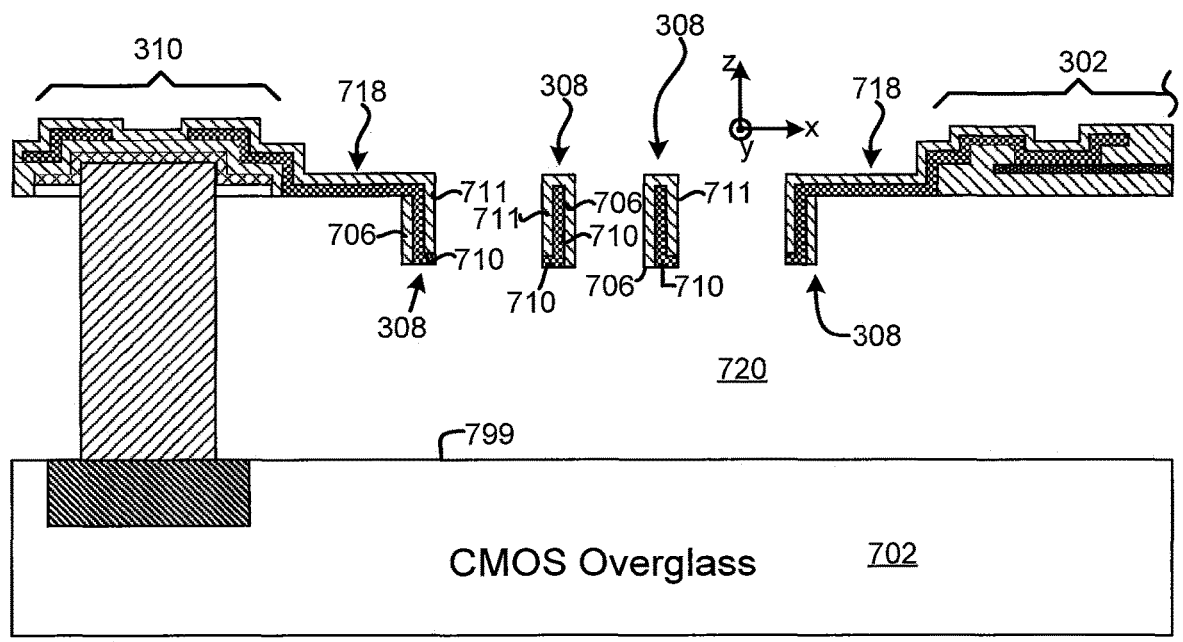

As shown in FIG. 7F, sacrificial layer 700 may then be removed to release bridge 302 and vertical legs 308 formed from metal layer 710 and dielectric layers 706 and 711 that partially surround metal layer 710. As shown, vertical legs 308 remain suspended above the ROIC with a space 720 interposed between the vertical legs and the ROIC. In this way, vertical legs 308 may be formed perpendicular to the x-y plane of FIG. 7F and run along a path (e.g., as illustrated in FIG. 3) that is disposed below the x-y plane of FIG. 7F between bridge 302 and contact 310 so that metal layer 710 forms a continuous conductive path between bridge contact 306 and contact 310 via legs 308.

Vertical legs 308 of FIG. 7F may include at least a portion that runs non-perpendicularly to a plane defined by the surface 799 of substrate 702. For example, vertical legs 308 may run along a path that is parallel to the surface 799. In another example, vertical legs 308 may run along a path that includes a portion that is parallel to surface 799 and an additional portion that bends downward toward surface 799 at a non-perpendicular angle.

In the example of FIG. 7F, the legs that couple bridge 302 to contact 310 may include vertical portions 308 and horizontal portions 718 that extend between bridge 302 and a first end of vertical leg 308 and between a second opposing end of vertical leg 308 and contact 310. In various embodiments, legs 308 may include any suitable combination of vertical and horizontal portions for providing sufficient performance for the microbolometer while avoiding reduction of the fill factor of the microbolometer array due to the area occupied by the legs.

Figure 8A:
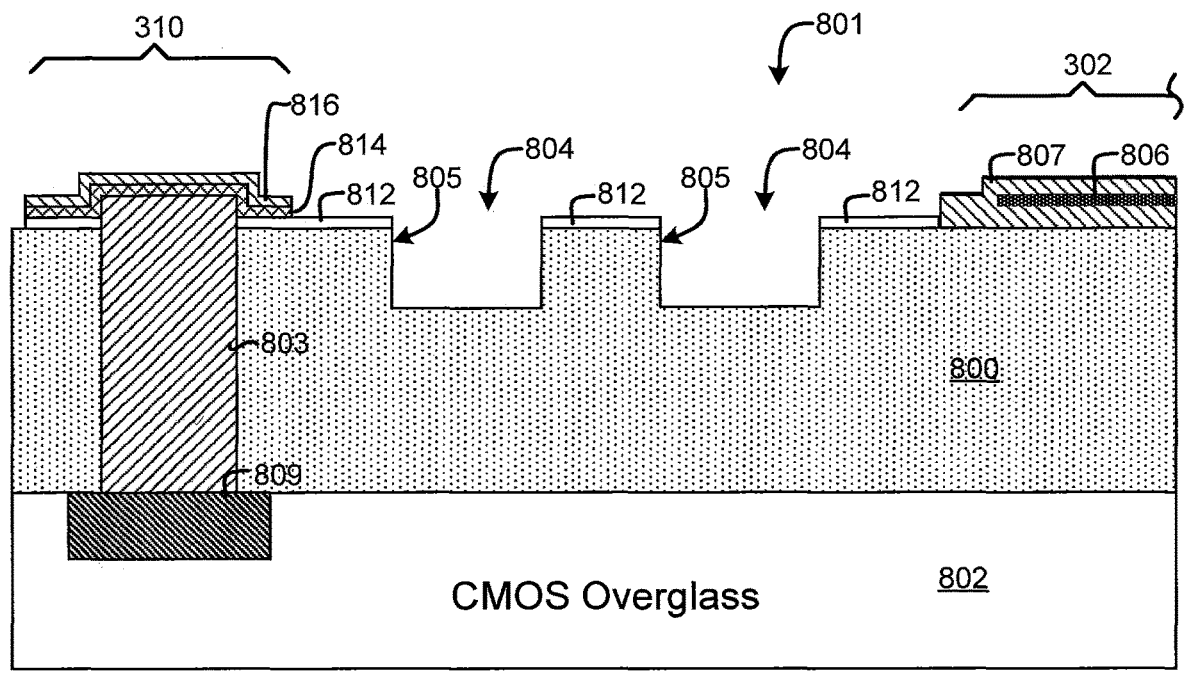
FIGS. 8A through 8C illustrate a yet another processing overview for manufacturing a vertical leg, such as for the vertical legs of FIG. 3, in accordance with an embodiment.
Figure 8B:
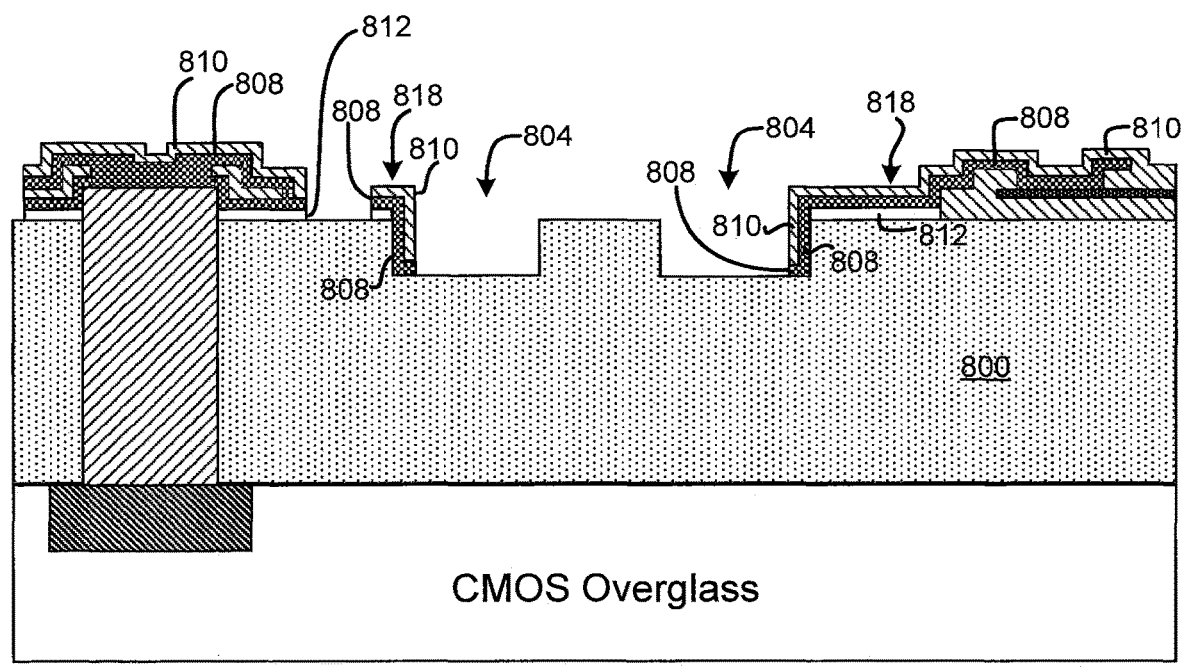
Figure 8C:
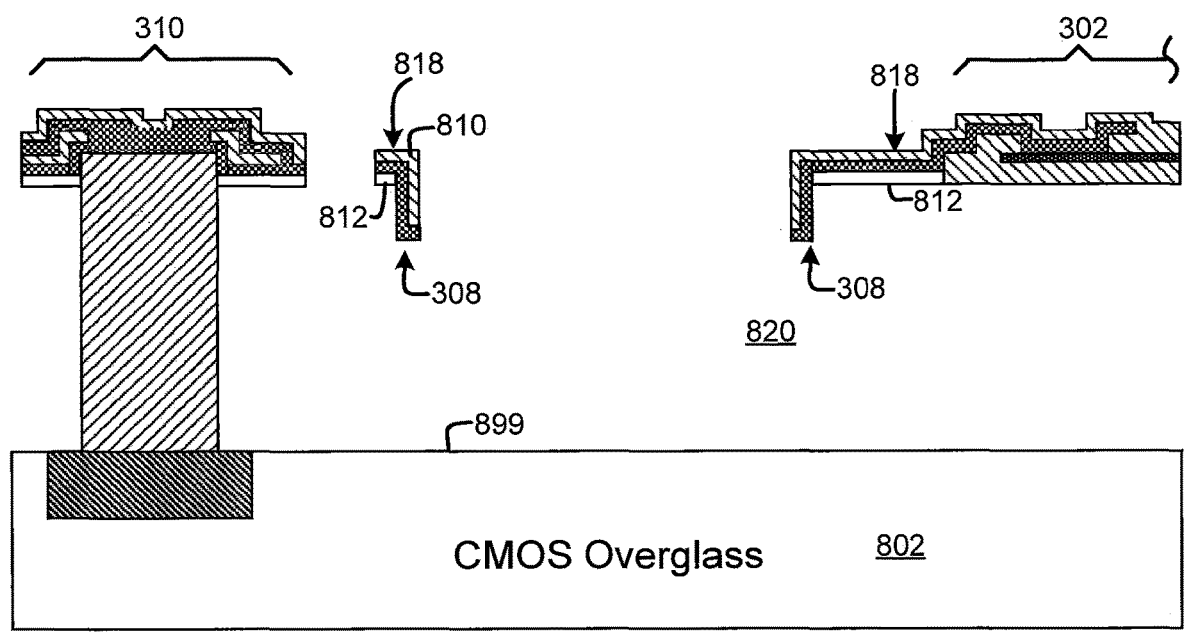

FIGS. 8A-8C are cross sectional side views of a portion of a microbolometer array at various stages during formation of vertical legs that illustrate yet another alternative process of vertical leg formation.

Turning now to FIG. 8A, a portion 801 of a microbolometer array is shown having a contact 310 and a bridge 302. As shown, bridge 302 includes a sensor layer (e.g., a layer of temperature sensitive resistive material such as VOx) 806 and one or more additional layers 807 such as absorber layers. As shown, contact 310 may be formed from a vertical conductive portion such as metal stud 803 and one or more layers such as a metal contact layer 814 in contact with metal stud 803. Contact 310 may include additional layers such as a dielectric layer 816 disposed over the metal layer 814 and an additional layer 812 such as a passivation layer disposed under portions of metal layer 814 and covering a top surface of a sacrificial layer 800. Passivation layer 812 may extend between bridge 302 and contact 310 on the top surface sacrificial layer 800.

Sacrificial layer 800 may be formed from, for example, polyimide. Layers 812 and 816 may be formed from, as examples, silicon dioxide or silicon nitride. Metal layer 814 may be formed from titanium, tungsten, copper, aluminum and/or other known metals.

Metal stud 803 may be conductively coupled to a conductive contact such as contact 809 of a readout integrated circuit (ROIC) such as a complementary metal-oxide-semiconductor (CMOS) ROIC. In the example of FIG. 8A, contact 809 is disposed in an overglass layer 802 (e.g., a CMOS overglass layer) of the ROIC. Prior to forming vertical legs between the bridge 302 and the contact 310, bridge 302 may be disposed on a sacrificial layer 800 that supports bridge 302 and fills a gap between bridges of the microbolometer array and the ROIC and runs continuously between the bridges and contacts of the microbolometer array.

According to one embodiment, a process for forming vertical legs between bridge 302 and contact 310 may include forming openings 804 in the sacrificial layer 800 that supports bridge 302 and in the passivation layer 812 that is disposed on the sacrificial layer as shown in FIG. 8A. Openings 804 may be formed in a portion of sacrificial layer 800 and passivation layer 812 that is at least partially disposed between the bridge 302 and the contact 310 so that openings 804 have vertical sidewalls 805 at various locations between bridge 302 and contact 310. As shown, sidewalls 805 may be formed from a portion of sacrificial layer 800 and passivation layer 812.

A metal layer such as a leg metal layer 808 may then be deposited (e.g., over contact 310, on portions of the top surface of passivation layer 812, on sidewalls 805 in contact with both sacrificial layer 800 and passivation layer 812, on portions of sacrificial layer 800 in openings 804, and on bridge 302) before a dielectric layer 810 is deposited (e.g., over metal layer 808) and then metal layer 808, dielectric layer 810, and passivation layer 812 may be patterned (e.g., in a masked spacer etch process) so that metal layer 808 remains on some of the sidewalls of openings 804, as shown in FIG. 8B. In this way, a metal leg may be formed vertically on some of the sidewalls of openings 804 and horizontal portions 818 having metal layer 808 interposed between passivation layer 812 and dielectric layer 810 may also remain on sacrificial layer 800.

Dielectric layer 810 may be formed from, as examples, silicon dioxide or a silicon nitride. Metal layer 808 may be a single metal layer formed form a homogeneous film of a single material or may include multiple materials (e.g., multiple layers of the same or different materials formed in multiple deposition operations). For example, metal layer 808 may be formed from titanium, tungsten, copper, aluminum and/or other known metals.

As shown in FIG. 8C, sacrificial layer 800 may then be removed to release bridge 302 and vertical legs 308 with horizontal portions 818. As shown, vertical legs 308 including horizontal portions 818 remain suspended above the ROIC with a space 820 interposed between the vertical legs and the ROIC. Vertical legs having some horizontal portions such as those shown in FIG. 8C may be less prone to movement and/or damage than legs having only vertical portions. Vertical legs 308 including horizontal portions 818 may form a continuous conductive path between bridge contact 306 and contact 310 via legs 308.

Vertical legs 308 of FIG. 8C may include at least a portion that runs non-perpendicularly to a plane defined by the surface 899 of substrate 802. For example, vertical legs 308 may run along a path that is parallel to the surface 899. In another example, vertical legs 308 may run along a path that includes a portion that is parallel to surface 899 and an additional portion that bends downward toward surface 899 at a non-perpendicular angle.

Figure 9:
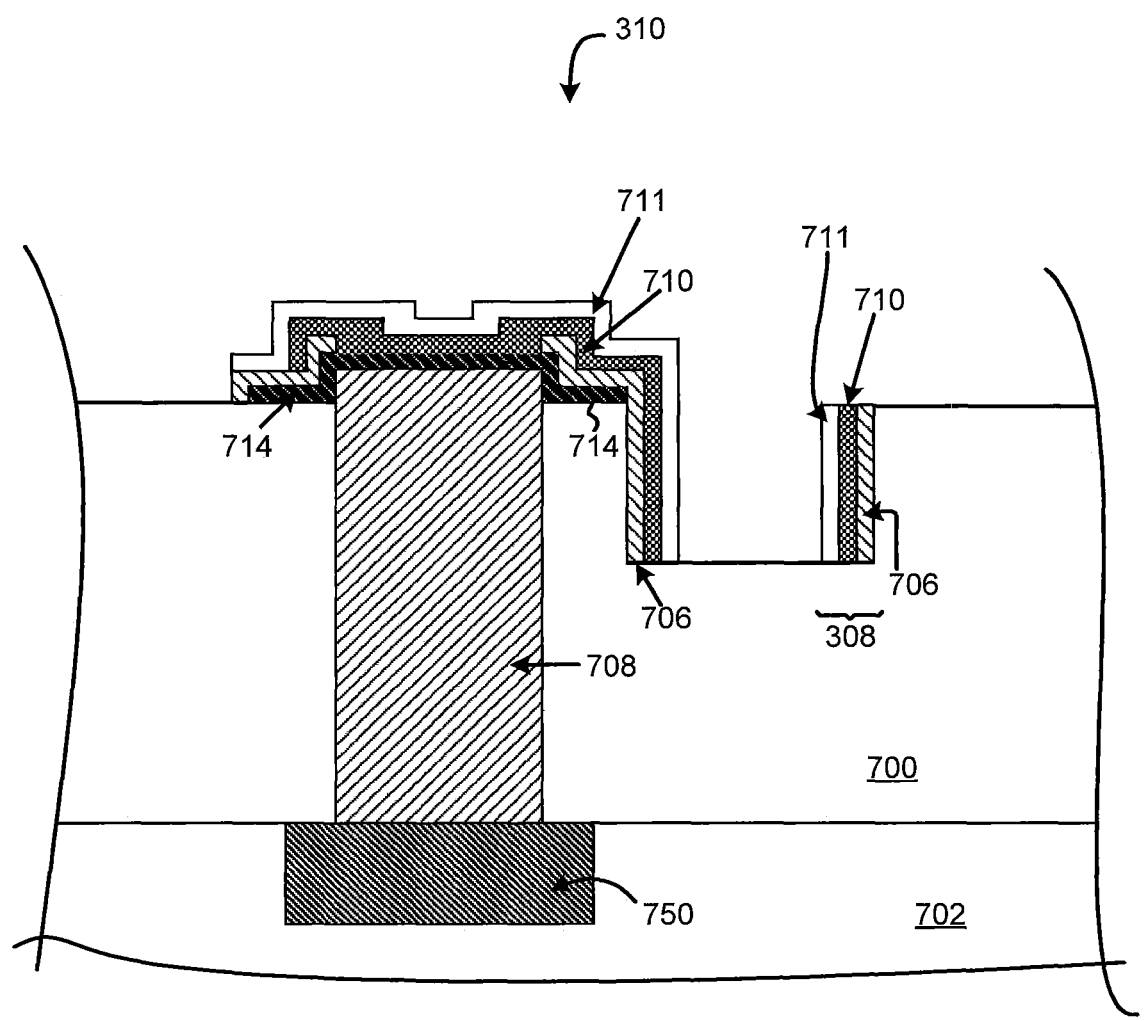
FIG. 9 shows a cross-sectional side view, in the vicinity of a vertical contact between an infrared detector array and a readout integrated circuit, of a portion of a focal plane array having vertical legs that are formed below a surface of the array, in accordance with an embodiment.
Figure 10:
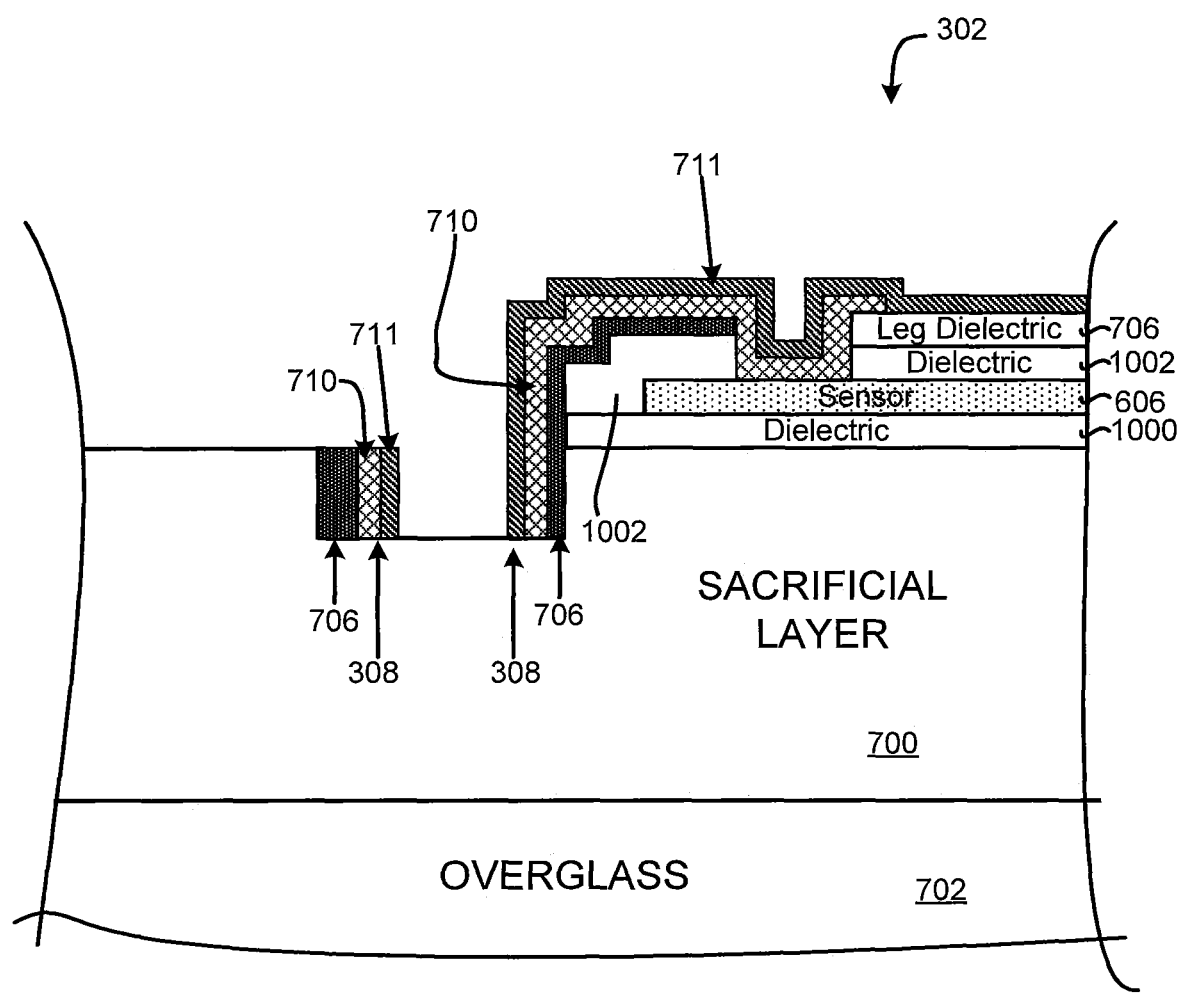
FIG. 10 shows a cross-sectional side view, in the vicinity of a sensor of the array, of a portion of a focal plane array having vertical legs that are formed below a surface of the array, in accordance with an embodiment.
Figure 11:
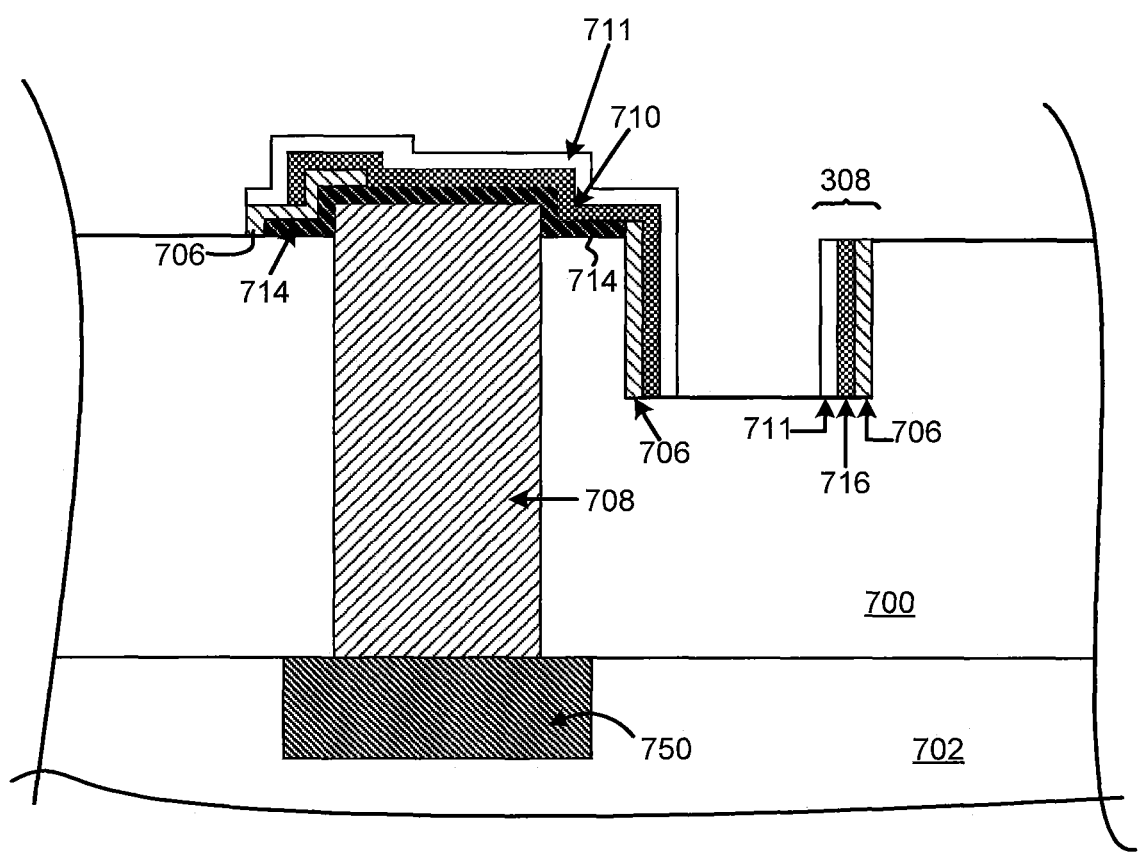
FIG. 11 shows a cross-sectional side view, in the vicinity of a vertical contact between an infrared detector array and a readout integrated circuit, of a portion of a focal plane array having vertical legs that are formed below a surface of the array, in accordance with an embodiment.
Figure 12:
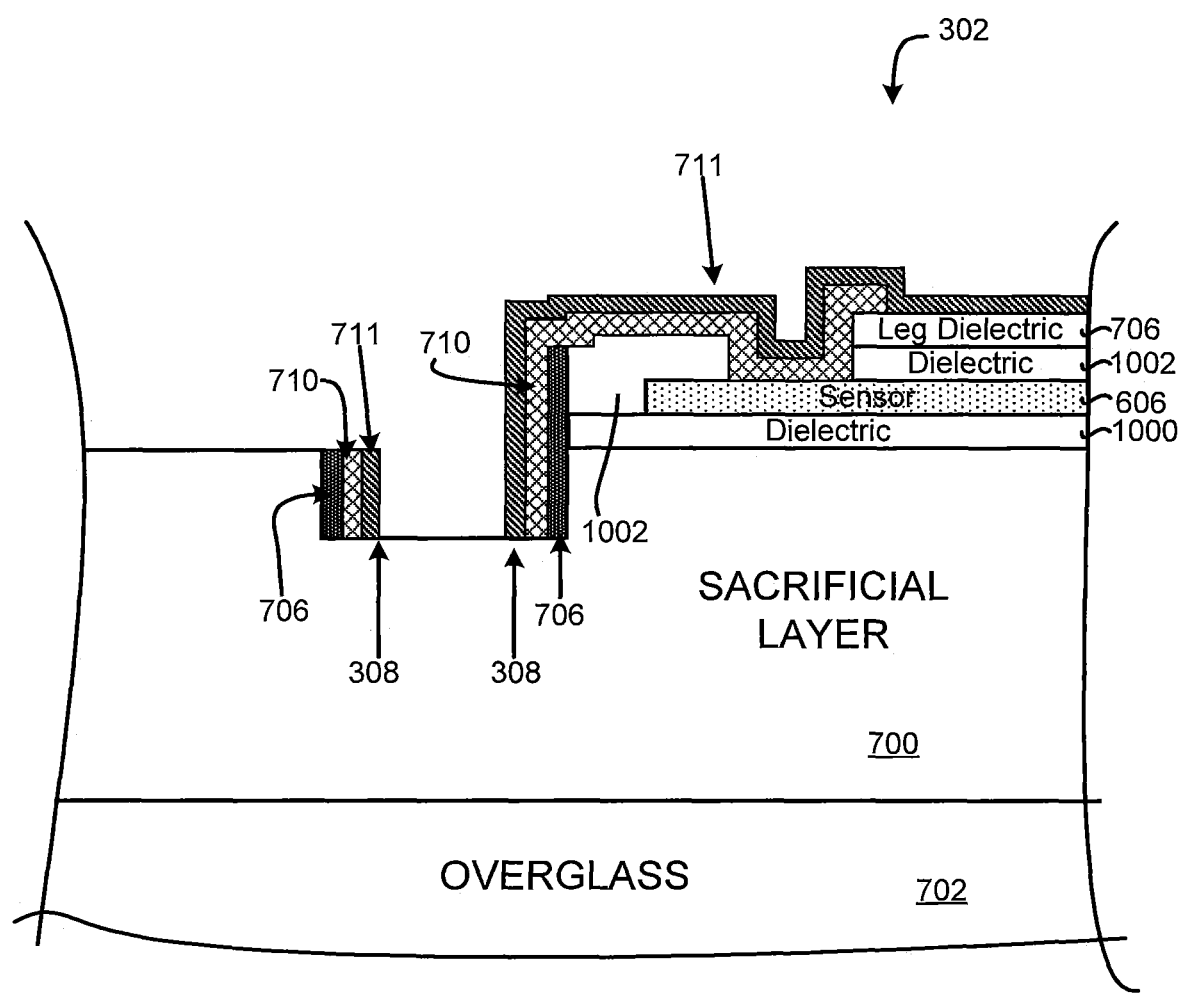
FIG. 12 shows a cross-sectional side view, in the vicinity of a sensor of the array, of a portion of a focal plane array having vertical legs that are formed below a surface of the array, in accordance with an embodiment.
Figure 14:
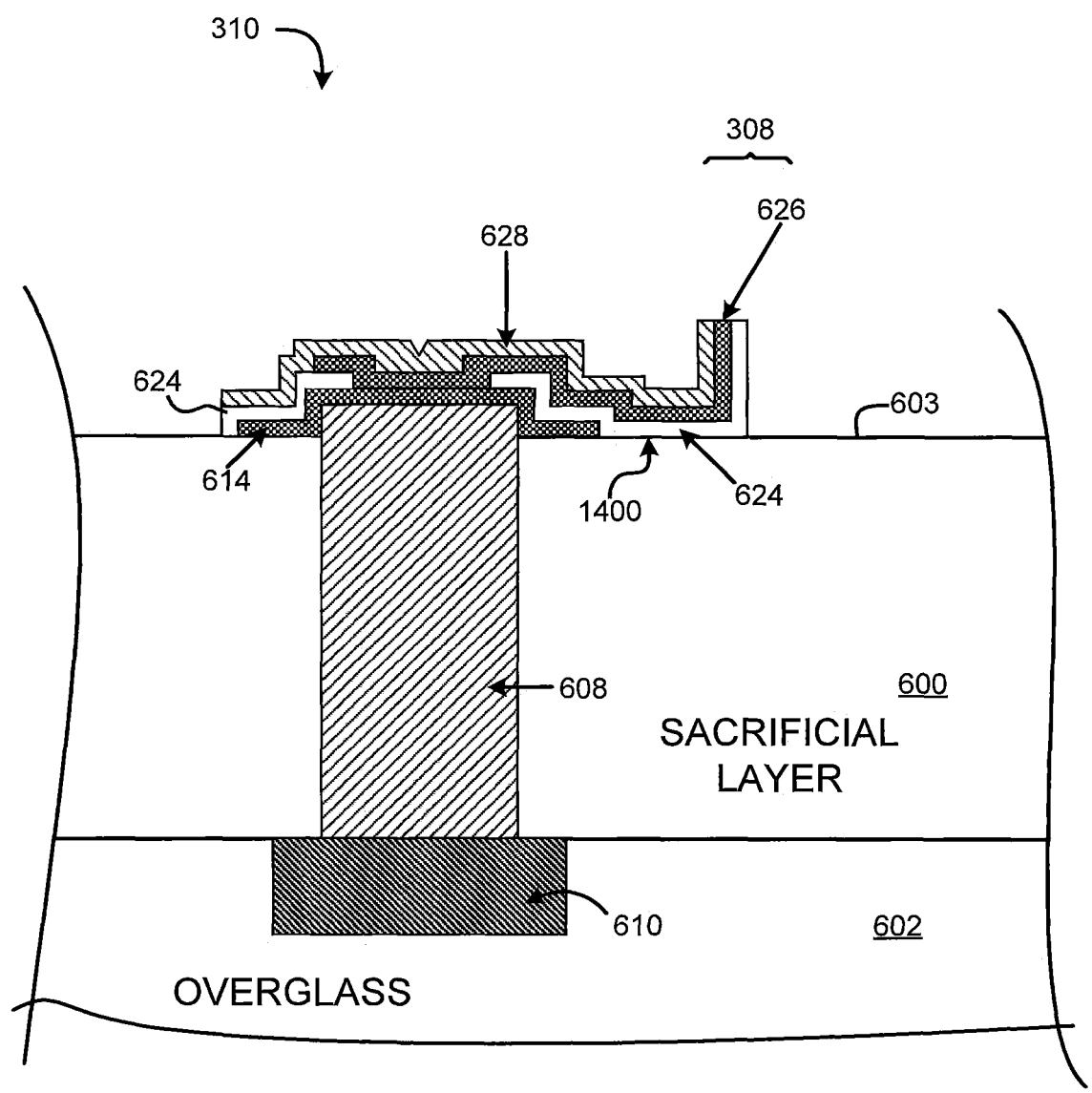
FIG. 14 shows a cross-sectional side view, in the vicinity of a vertical contact between an infrared detector array and a readout integrated circuit, of a portion of a focal plane array having vertical legs formed at or above a surface of the array, in accordance with an embodiment.
Figure 15:
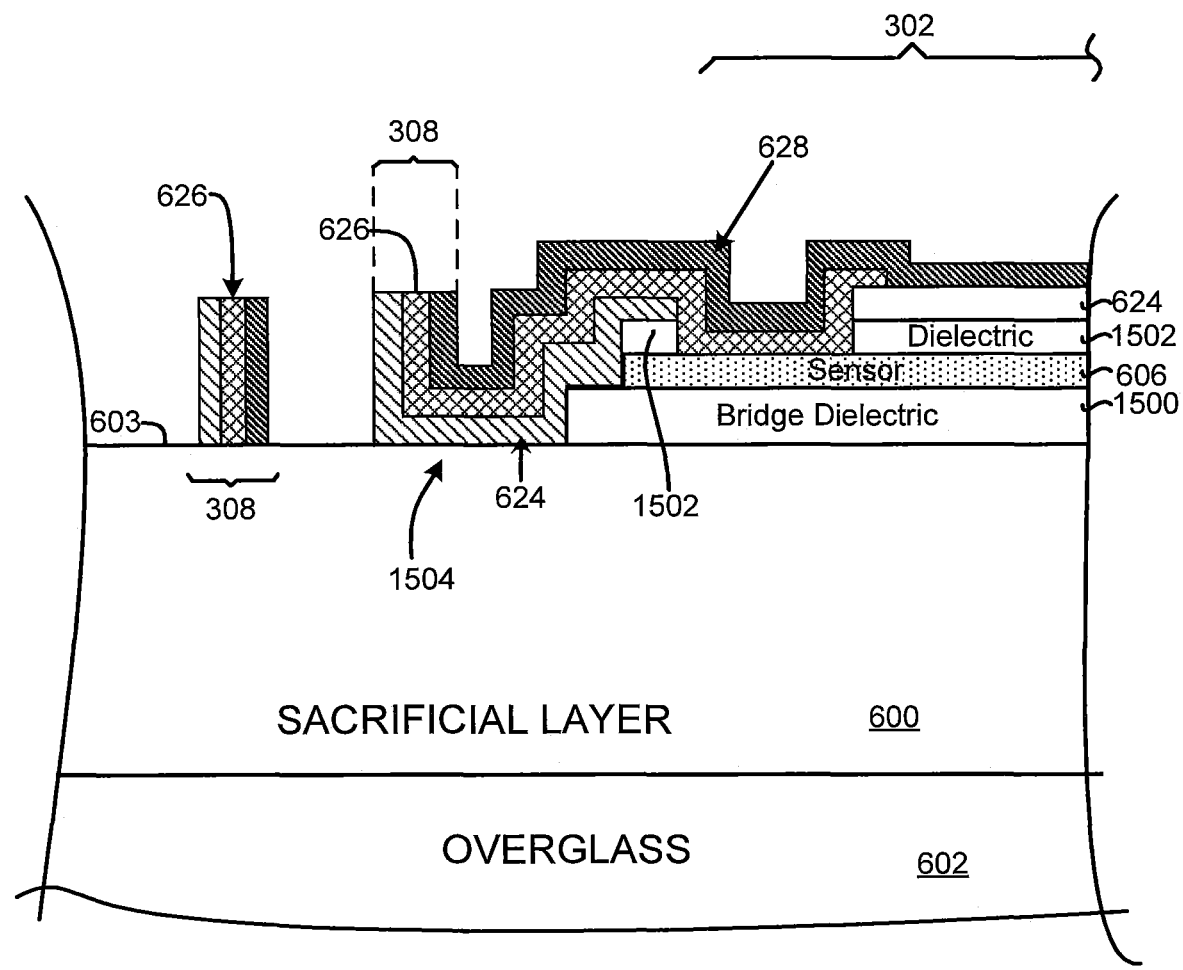
FIG. 15 shows a cross-sectional side view, in the vicinity of a sensor of the array, of a portion of a focal plane array having vertical legs formed above a surface of the array, in accordance with an embodiment.

It will be appreciated that the processes described above in connection with FIGS. 6A-8C can be modified, rearranged, and/or omitted to form vertical bolometer legs having various shapes, sizes, orientations, and arrangements as desired for various purposes. FIGS. 9, 10, 11, 12, 13A-13Q, 14, and 15 show various arrangements of vertical legs and associated contacts or bridges that can be formed for microbolometer arrays. In particular, FIGS. 9 and 10 show portions of a microbolometer array (prior to release by removal of a sacrificial layer) having vertical legs formed below the plane of the bridge in the vicinity of a contact and a bridge, respectively, of a microbolometer, according to one embodiment. FIGS. 11 and 12 show portions of a microbolometer array having vertical legs formed below the plane of the bridge in the vicinity of a contact and a bridge, respectively, of a microbolometer, according to another embodiment. FIGS. 13A-13Q show various arrangements of metal and insulation for vertical legs for a microbolometer. FIGS. 14 and 15 show portions of a microbolometer array having vertical legs formed at or above the plane of the bridge in the vicinity of a contact and a bridge, respectively, of a microbolometer, according to another embodiment.

As shown in FIG. 9, at a particular stage of production, a portion of metal layer 714 may be formed on sacrificial layer 700 and a portion of dielectric layer 706 may extend over the portion of metal layer 714 that is formed on the sacrificial layer, over a vertical portion of metal layer 714 that is formed on stud 708, and over a horizontal portion of metal layer 714 that is formed on top of stud 708 such that the portion of dielectric layer 706 that is disposed above the top surface of sacrificial layer 700 is symmetric on multiple sides of stud 708. Sacrificial layer 700 may then be removed.

A process that results in the structure of FIG. 9 for contact 310 may also form a bridge as shown in FIG. 10 according to an embodiment. As shown in FIG. 10, bridge 302 may include bridge dielectric layers 1000 and 1002 disposed on opposing sides of sensor layer 606. Dielectric layer 706 may extend vertically from a vertical leg structure 308 and over a portion of bridge dielectric 1002. Metal layer 710 may cover the portion of dielectric layer 706 that extends vertically from the vertical leg structure 308 and over the portion of bridge dielectric 1002 and the metal layer may extend through bridge dielectric 1002 and leg dielectric 706 to contact sensor layer 606.

In an alternative embodiment, as shown in FIG. 11, metal layer 710 may be asymmetric about the top of stud 708 so that metal layer 710 remains in contact with metal layer 714 of contact 310 on the side of stud 708 on which the vertical legs 308 are formed, thereby increasing the contact area between layers 710 and 714. Following formation of the structures of FIG. 11 as shown, sacrificial layer 700 may be removed.

A process that results in the structure of FIG. 11 for contact 310 may also form a bridge as shown in FIG. 12 according to an embodiment. As shown in FIG. 12, a portion of metal layer 710 may be formed directly on a portion of bridge dielectric 1002 so that metal layer 710 passes over the portion of bridge dielectric 1002 and through bridge dielectric 1002 to contact sensor layer 606.

FIGS. 13A-13Q each show a cross sectional view of an exemplary implementation of a vertical bolometer leg such as vertical legs 308 as described herein. As shown in FIG. 13A, a vertical bolometer leg may include a substantially vertical conductive (e.g., metal) layer 1300 that is disposed between first and second substantially vertical dielectric layers 1302 and 1304 that have a common height H with the vertical conductive layer 1300. In the configuration of FIG. 13A, the vertical leg may have a width that is substantially the same along the height of the vertical leg and substantially equal to the sum of the widths of the layers 1300, 1302, and 1304.

In general, a vertical bolometer leg may have a first dimension (e.g., a height H) that extends in a direction that is perpendicular to a plane defined by the associated bolometer bridge and/or a substrate, a second dimension (e.g., a width W) that extends in a direction that is parallel to the plane of the bridge and/or the substrate, and a third dimension that extends along and defines a signal path, where the path may include a portion that extends in a direction parallel to the plane of the bridge and/or the substrate, and where the second dimension is substantially smaller than the first dimension.

As shown in FIG. 13B, in one embodiment, dielectric layer 1302 may extend above the top of conductive layer 1300 and run horizontally over the top of conductive layer 1300 and dielectric layer 1304. As shown in FIG. 13C, in one embodiment, conductive layer 1300 may have a height that is shorter than the height of dielectric layer 1302 and dielectric layer 1302 may run underneath the bottom of conductive layer 1300 and dielectric layer 1304.

As shown in FIG. 13D, in one embodiment, dielectric layer 1302 may extend above the top of conductive layer 1300 and run horizontally over the top of conductive layer 1300 and dielectric layer 1304 and conductive layer 1300 may have a height that is shorter than the height of dielectric layer 1302 and dielectric layer 1304 may run underneath the bottom of conductive layer 1300 to dielectric layer 1302. As shown in FIG. 13E, in one embodiment, conductive layer 1300 may have a height that is shorter than the height of dielectric layer 1302, dielectric layer 1304 may run underneath the bottom of conductive layer 1300 to dielectric layer 1302, and a horizontal dielectric layer 1306 may cover the top of layers 1300, 1302, and 1304.

As shown in FIG. 13F, in one embodiment, conductive layer 1300 and dielectric layers 1302 and 1304 may have a common height and a horizontal dielectric layer 1306 may cover the top of layers 1300, 1302, and 1304. As shown in FIG. 13G, in one embodiment, conductive layer 1300 may have a vertical portion and a horizontal portion such that conductive layer has, in cross section, an "L" shape. In the configuration of FIG. 13G, dielectric layer 1304 runs vertically along the vertical portion of conductive layer 1300 and horizontally under the vertical and horizontal portions of conductive layer 1300 and dielectric layer 1302 runs vertically along the vertical portion of conductive layer 1300, horizontally over the top of the horizontal portion of conductive layer 1300, and vertically past the horizontal portion of conductive layer 1300 to the bottom of the vertical leg.

As shown in FIG. 13H, in one embodiment, conductive layer 1300 may be free of any surrounding dielectric material. As shown in FIG. 13I, in one embodiment, conductive layer 1300 may have one side covered by dielectric layer 1304 and an opposing side that is free of dielectric material. As shown in FIG. 13J, in one embodiment, a conductive layer 1300 that has one side covered by dielectric layer 1302 and an opposing side that is free of dielectric material may have a height that is shorter than the height of the vertical leg and dielectric layer 1302 may run underneath the bottom of conductive layer 1300. As shown in FIG. 13K, in one embodiment, a conductive layer 1300 that has one side covered by dielectric layer 1302 and an opposing side that is free of dielectric material may have a vertical portion and a horizontal portion that runs over the top of dielectric layer 1302.

As shown in FIG. 13L, in one embodiment, a conductive layer 1300 that has one side covered by dielectric layer 1304 and an opposing side that is free of dielectric material may have a first vertical portion, a horizontal portion that runs over the top of dielectric layer 1304, and a second vertical portion that is offset from the first vertical portion. In the configuration of FIG. 13L, dielectric layer 1304 may have a vertical portion that runs along the first vertical portion of conductive layer 1300 and a horizontal portion that runs under the first vertical portion of conductive layer 1300 to the second vertical portion of conductive layer 1300.

As shown in FIG. 13M, conductive layer 1300 may include a vertical portion and a horizontal portion 1308 that extends horizontally from the bottom of the vertical portion of conductive layer 1300 so that conductive layer 1300 and horizontal portion 1308 form an "L" shape. In the example of FIG. 13M, conductive layer 1300 is covered on a first side by dielectric (insulating) layer 1302, on another side by dielectric (insulating) layer 1304, and along a bottom surface of horizontal portion 1308 by insulating (dielectric layer 1312).

As shown in FIG. 13N, in one embodiment, horizontal portion 1308 and the part of the vertical portion that is below the top surface of the vertical portion may be substantially surrounded by one or more dielectric layers such as dielectric layers 1302, 1304, and 1312 so that the top end of the vertical portion of conductive layer 1300 is free of dielectric material.

As shown in FIG. 13O, in one embodiment, conductive portion 1300 may have a vertical portion, a first horizontal portion that extends in a first direction from the top of the vertical portion, a second horizontal portion that extends in an opposing second direction from the bottom of the vertical portion, and an additional portion that fills the space beneath a horizontal dielectric layer 1304 formed under the first horizontal portion. In the configuration of FIG. 13O, the first horizontal portion, the vertical portion and top of the second horizontal portion of conductive layer 1300 are covered on one side by dielectric layer 1302.

As shown in FIG. 13P, in one embodiment, conductive layer 1300 may have a vertical portion, a first horizontal portion that extends in a first direction from the top of the vertical portion, and a second horizontal portion that extends in an opposing second direction from the bottom of the vertical portion. In the configuration of FIG. 13P, the first horizontal portion, the vertical portion and top of the second horizontal portion of conductive layer 1300 are covered on one side by dielectric layer 1302 and dielectric layer 1304 runs under and fills the space under the first horizontal portion of conductive layer 1300. As shown in FIG. 13Q, a conductive layer having a vertical portion, a first horizontal portion that extends in a first direction from the top of the vertical portion, and a second horizontal portion that extends in an opposing second direction from the bottom of the vertical portion may be substantially surrounded by an insulating material 1312.

As shown in FIG. 14, at a particular stage of production for vertical bolometer legs formed above and perpendicular to surface 603 of a sacrificial layer such as sacrificial layer 600 (e.g., the sacrificial layer upon which the bridge structures for one or more microbolometers are formed), a portion of metal layer 614 may be formed on sacrificial layer 600 and a portion of dielectric layer 624 may extend over the portion of metal layer 614 that is formed on the sacrificial layer, over a vertical portion of metal layer 614 that is formed on stud 608, and over a horizontal portion of metal layer 614 that is formed on top of stud 608. Dielectric layer 624, leg metal layer 626, and dielectric layer 628 may form a horizontal portion 1400 that extends horizontally from contact 310 and turns perpendicularly to form vertical leg portion 308. Sacrificial layer 600 may then be removed.

A process that results in the structure of FIG. 14 for contact 310 may also form a bridge as shown in FIG. 15 according to an embodiment. As shown in FIG. 15, bridge 302 may include bridge dielectric layers 1500 and 1502 disposed on opposing sides of sensor layer 606. Dielectric layer 624, metal layer 626, and dielectric layer 628 may form a stack that includes vertical leg portions 308 and a portion 1504 that extends horizontally from a vertical leg portion 308 to bridge 302. As shown, metal layer 626 may cover a portion of dielectric layer 624 that extends horizontally from the vertical leg structure 308 and over a portion of bridge dielectric 1502 and may pass through bridge dielectric 1502 and leg dielectric 624 to contact sensor layer 606.

Figure 16:
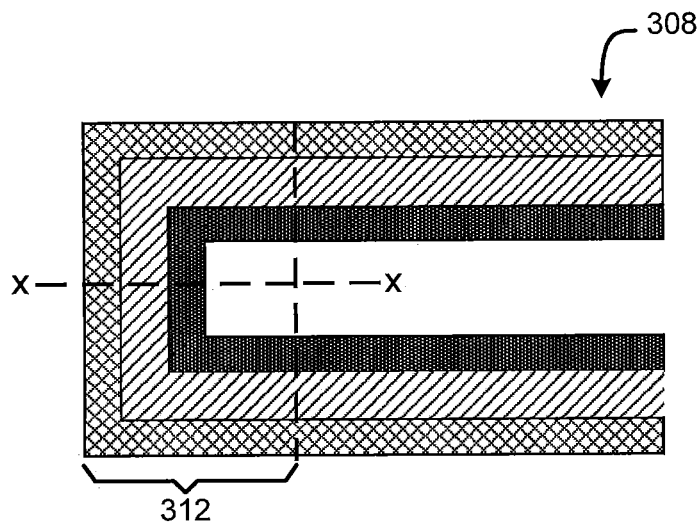
FIG. 16 shows a top view of a bend portion of a vertical leg, such as for the vertical legs of FIG. 3 in the vicinity of a bend in the vertical leg, in accordance with an embodiment.
Figure 17:
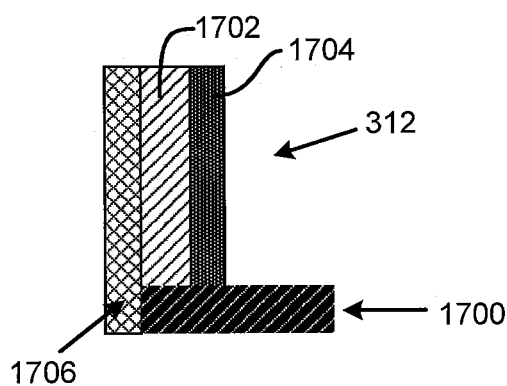
FIG. 17 shows a cross-sectional view of an example arrangement of the vertical leg of FIG. 16, in accordance with an embodiment.
Figure 18:
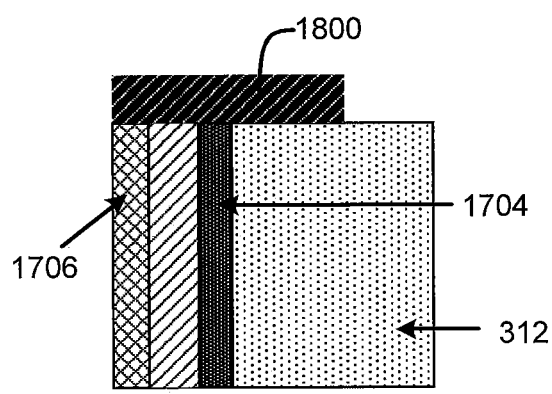
FIG. 18 shows a cross-sectional view of another example arrangement of the vertical leg of FIG. 16, in accordance with an embodiment.

FIG. 16 shows a top view of a portion of a vertical leg 308 in a bend region 312. FIGS. 17 and 18 show cross sectional side views of exemplary implementations of the bend region 312 taken along the line x-x of FIG. 16. As shown in FIG. 17, according to one embodiment, bend region 312 may include a pad 1700 formed at the bottom of a vertical conductive layer 1702 that is interposed between vertical dielectric layers 1704 and 1706 of the vertical leg. Pad 1700 may be formed from metal, dielectric materials, or a combination of metal and dielectric materials (as examples). As shown in FIG. 18, according to one embodiment, bend region 312 may include a metal pad 1800 formed over the top of vertical conductive layer 1702 and vertical dielectric layers 1704 and 1706 of the vertical leg. Pad 1800 may be formed from metal, dielectric materials, or a combination of metal and dielectric materials (as examples).

Figure 19:
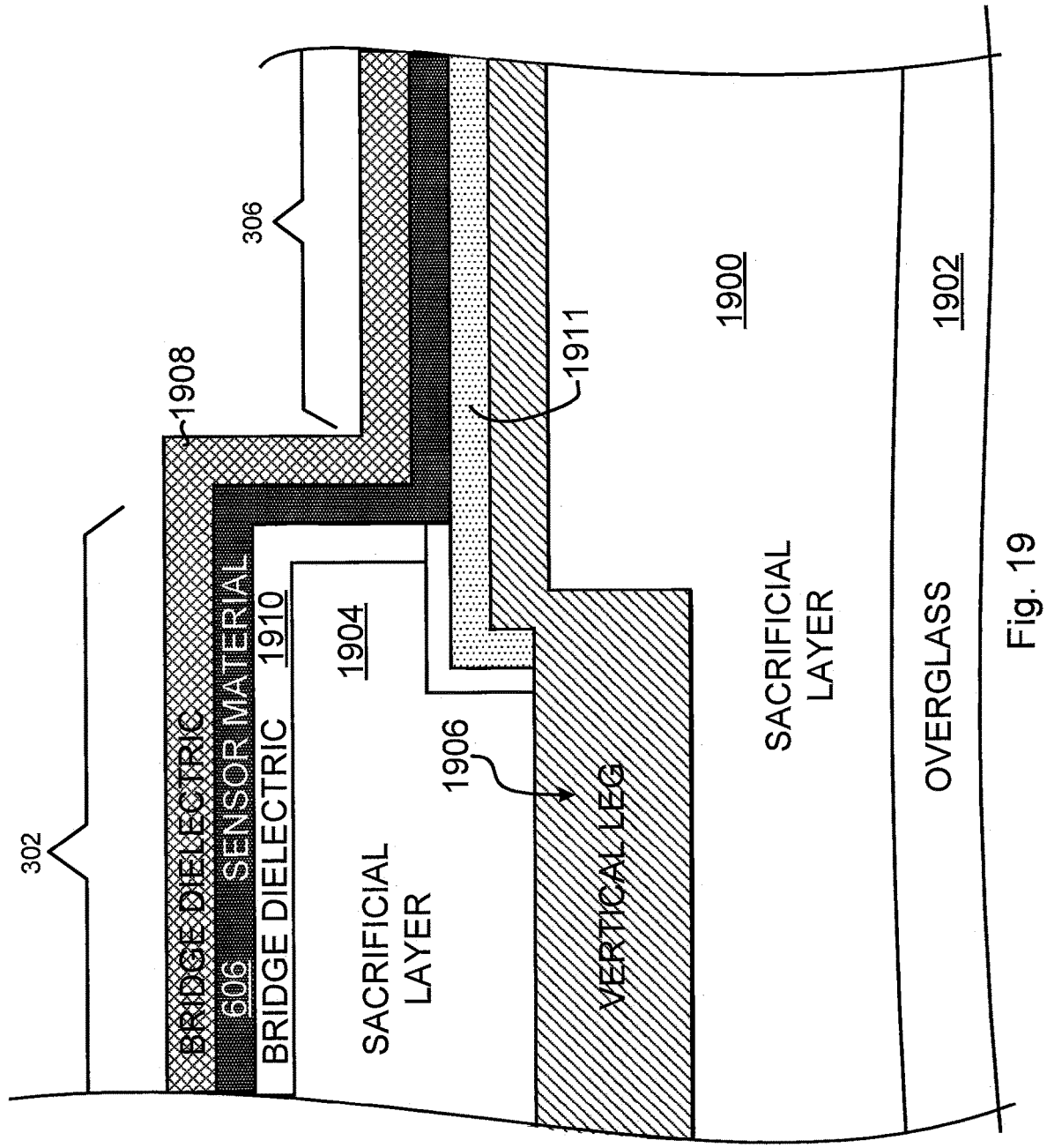
FIG. 19 shows a cross-sectional view of a portion of a focal plane array having legs, such as legs for an infrared detector, that are formed at least partially beneath a bridge portion of the infrared detector, in accordance with an embodiment.

FIG. 19 is a cross sectional side view of a portion of a microbolometer array at a particular stage of production showing how, in one embodiment, at least a portion of a vertical leg structure may be formed beneath the bridge 302 of a microbolometer. As shown in FIG. 19, bridge 302 may include a sensor layer 606 disposed between bridge dielectric layers 1908 and 1910. Bridge dielectric layer 1910 may be formed on a first sacrificial layer 1904 that is interposed between bridge dielectric layer 1910 and a vertical leg structure 1906 that runs beneath the bridge dielectric layer 1910 and overglass 1902 of an ROIC for the microbolometer array. At the stage of production shown in FIG. 19, a second sacrificial layer 1900 may be disposed between the vertical leg structure 1906 and overglass 1902.

In the configuration shown in FIG. 19, sensor layer 606 of bridge 302 includes a vertical portion that runs downward from the bridge 302 and turns horizontally to form a portion of bridge contact 306. As shown, a conductive layer such as conductive layer 1911 may couple sensor material 606 in bridge contact region 306 to the vertical leg structure 1906. Vertical leg structure 1906 may extend to a contact such as a stud contact or basket contact that couples the vertical leg structure 1906 to a contact on the ROIC (e.g., a contact formed partially or completely within overglass layer 1902). Vertical leg structure 1906 may couple to a dedicated contact structure for the bridge 302 underneath which it is formed and/or may be coupled to a shared contact with an adjacent microbolometer.

Figure 20:
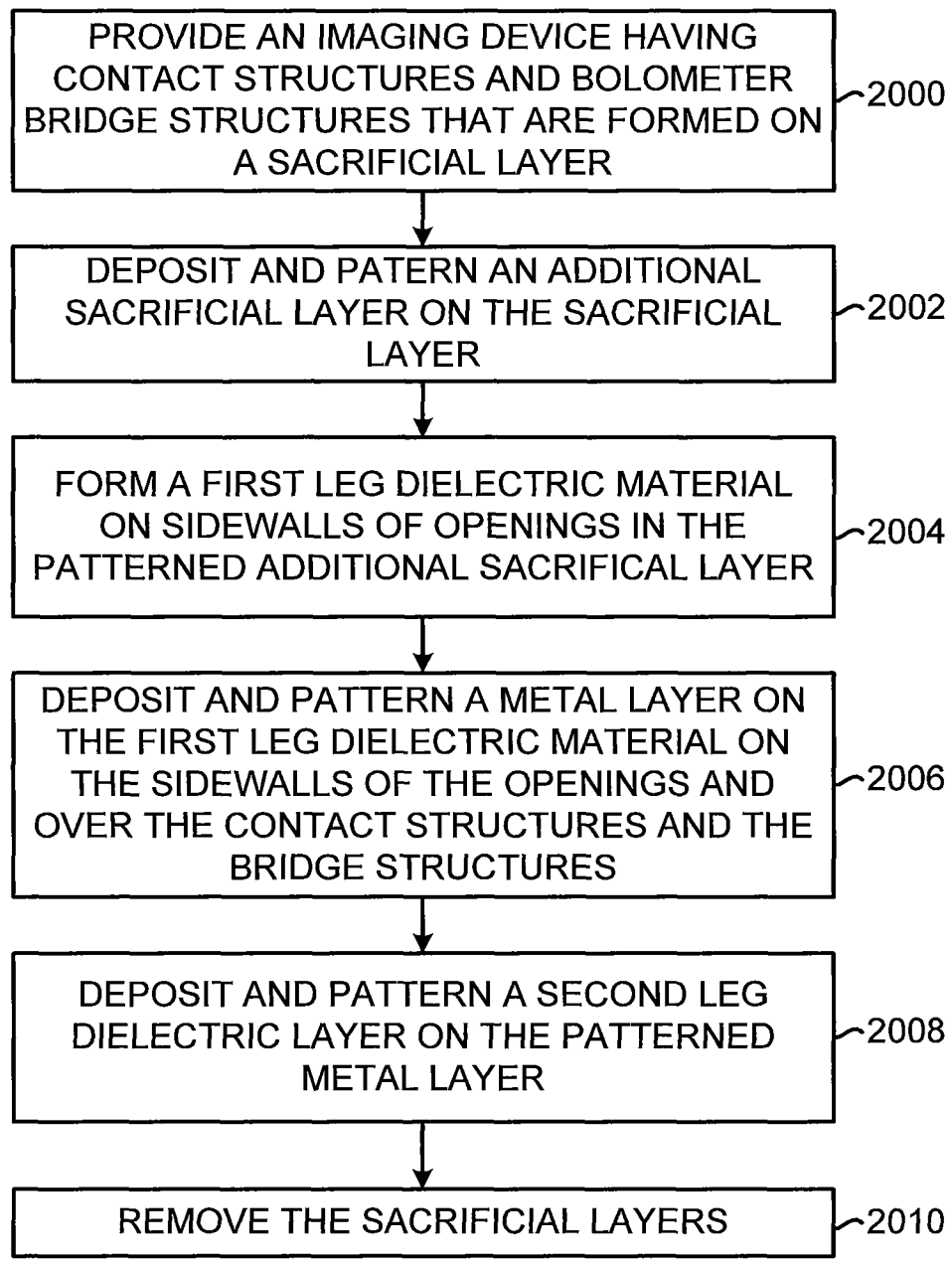
FIG. 20 illustrates a flow diagram for manufacturing a vertical leg, such as for the vertical legs of FIG. 3, in accordance with an embodiment.

FIG. 20 is a flowchart of illustrative operations that may be performed for forming vertical microbolometer legs for coupling a microbolometer bridge to a ROIC contact structure according to an embodiment.

At block 2000, an imaging device having contact structures and bolometer bridge structures such as microbolometer bridge structures may be provided. The imaging device may include a partially fabricated focal plane array on which a sacrificial layer such as a polyimide layer is formed on a substrate such as a readout integrated circuit and the bridge structures are formed on the sacrificial layer. In some embodiments, an etch stop layer may be formed on the sacrificial layer. However, in other embodiments, the sacrificial layer may be free of any etch stop material. The contact structures may include an electrical contact on the readout integrated circuit and, if desired conductive elements that extend from the electrical contact on the ROIC through some or all of the sacrificial layer. The conductive elements may include a stud or a basket contact and, if desired, one or more additional structures such as passivation layers, metal layers, and/or dielectric layers formed over the conductive elements.

At block 2002, an additional sacrificial layer may be deposited and patterned over or on the sacrificial layer. In embodiments, in which an etch stop layer is provided on the sacrificial layer, the additional sacrificial layer may be deposited on the etch stop layer so that portions of the etch stop layer are formed between the sacrificial layer and the additional sacrificial layer. Patterning the additional sacrificial layer may include etching the additional sacrificial layer to form openings in the additional sacrificial layer at least partially between the bridge structures and the contact structures.

At block 2004, a first leg dielectric material may be formed at least on sidewalls of the openings in the patterned additional sacrificial layer. Forming the first leg dielectric material on the sidewalls of the openings may include depositing the first leg dielectric layer and performing a spacer etch of the first leg dielectric layer. The etch may also leave portions of the first leg dielectric layer on portions of the contact structures and/or the bridge structures as desired.

At block 2006, one or more conductive layers such as a leg metal layer may be deposited (e.g., using a blanket metal deposition) and patterned on the first leg dielectric material on the sidewalls of the openings and over at least some of the contact structures and the bridge structures. The leg metal layer may be formed in contact with a metal layer of the contact structures and with a sensor layer of the bridge structures.

At block 2008, a second leg dielectric layer may be deposited and patterned on the metal layer. Patterning the second leg dielectric layer may include depositing the second leg dielectric layer over the leg metal layer prior to patterning the leg metal layer and performing an in-situ dielectric and metal etch of the leg metal layer and the second leg dielectric layer.

At block 2010, the sacrificial layer and the additional sacrificial layer may be removed to release the bridge structures and the vertical leg structures formed from the first and second leg dielectric layers and the leg metal layers so that the bridge and legs are suspended above the readout integrated circuit and the contact structures are coupled to the bridge structures by the vertical leg structures. In embodiments, in which an etch stop layer is provided on the sacrificial layer, portions of the etch stop layer may also be removed.

Figure 21:
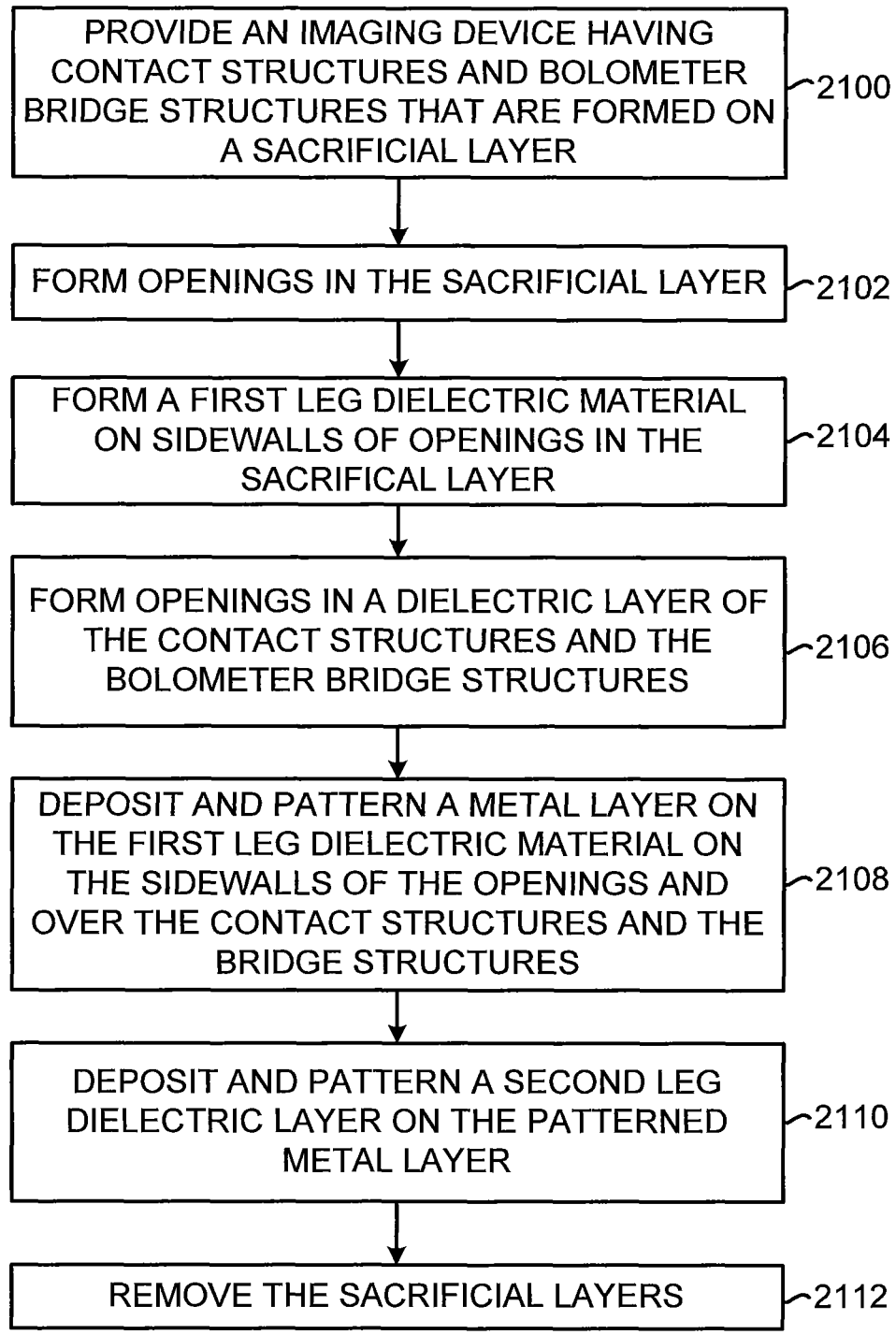
FIG. 21 illustrates another flow diagram for manufacturing a vertical leg, such as for the vertical legs of FIG. 3, in accordance with an embodiment.

FIG. 21 is a flowchart of illustrative operations that may be performed for forming vertical microbolometer legs for coupling a microbolometer bridge to a ROIC contact structure according to another embodiment.

At block 2100, an imaging device having contact structures and bolometer bridge structures such as microbolometer bridge structures may be provided. The imaging device may include a partially fabricated focal plane array on which a sacrificial layer such as a polyimide layer is formed on a readout integrated circuit and the bridge structures are formed on the sacrificial layer. The contact structures may include an electrical contact on the readout integrated circuit and, if desired conductive elements that extend from the electrical contact on the ROIC through some or all of the sacrificial layer. The conductive elements may include a stud or a basket contact and, if desired, one or more additional structures such as passivation layers, metal layers, and/or dielectric layers formed over the conductive elements.

At block 2102, the sacrificial layer may be etched to form openings in the sacrificial layer at least partially between the bridge structures and the contact structures.

At block 2104, a first leg dielectric material may be formed at least on sidewalls of the openings in the sacrificial layer. Forming the first leg dielectric material on the sidewalls of the openings may include depositing the first leg dielectric layer and performing a spacer etch of the first leg dielectric layer. The etch may also be performed to leave portions of the first leg dielectric layer on portions of the contact structures and/or the bridge structures as desired.

At block 2106, openings may be formed in a dielectric layer of the contact structures and the bridge structures. Forming the openings in the dielectric layer of the contact structures and the bridge structures may expose portions of a metal layer of the contact structures and/or a sensor layer of the bridge structures.

At block 2108, one or more conductive layers such as a leg metal layer may be deposited (e.g., using a blanket metal deposition) and patterned on the first leg dielectric material on the sidewalls of the openings and over at least some of the contact structures and the bridge structures. The leg metal layer may be formed in contact with the exposed portions of the metal layer of the contact structures and the sensor layer of the bridge structures.

At block 2110, a second leg dielectric layer may be deposited and patterned on the metal layer. Patterning the second leg dielectric layer may include depositing the second leg dielectric layer over the leg metal layer prior to patterning the leg metal layer and performing an in-situ dielectric and metal etch of the leg metal layer and the second leg dielectric layer.

At block 2112, the sacrificial layer may be removed to release the bridge structures and the vertical leg structures formed from the first and second leg dielectric layers and the leg metal layers so that the bridge and legs are suspended above the readout integrated circuit and the contact structures are coupled to the bridge structures by the vertical leg structures.

Figure 22:
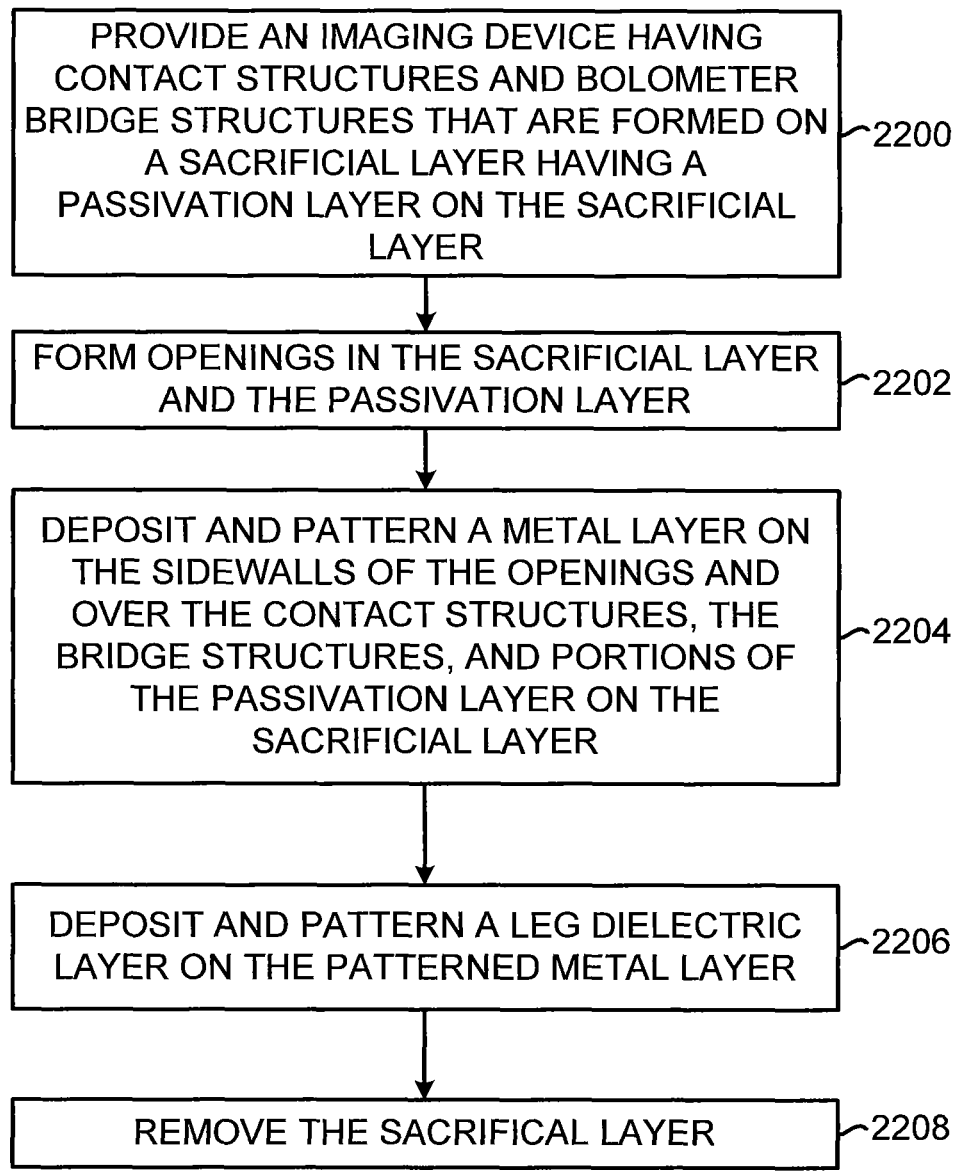
FIG. 22 illustrates yet another flow diagram for manufacturing a vertical leg, such as for the vertical legs of FIG. 3, in accordance with an embodiment.

FIG. 22 is a flowchart of illustrative operations that may be performed for forming vertical microbolometer legs for coupling a microbolometer bridge to a ROIC contact structure according to another embodiment.

At block 2200, an imaging device having contact structures and bolometer bridge structures such as microbolometer bridge structures may be provided. The imaging device may include a partially fabricated focal plane array on which a sacrificial layer such as a polyimide layer is formed on a readout integrated circuit, a passivation layer is formed on at least a portion of the sacrificial layer and the bridge structures are formed on the sacrificial layer. The contact structures may include an electrical contact on the readout integrated circuit and, if desired conductive elements that extend from the electrical contact on the ROIC through some or all of the sacrificial layer. The conductive elements may include a stud or a basket contact and, if desired, one or more additional structures such as a portion of the passivation layer, metal layers, and/or dielectric layers formed over the conductive elements.

At block 2202, the sacrificial layer and the passivation layer may be etched to form openings in the sacrificial layer and the passivation layer at least partially between the bridge structures and the contact structures.

At block 2204, one or more conductive layers such as a leg metal layer may be deposited (e.g., using a blanket metal deposition) and patterned on the sidewalls of the openings and over at least some of the contact structures, the bridge structures, and portions of the passivation layer on the sacrificial layer.

At block 2206, a leg dielectric layer may be deposited and patterned on the metal layer. Patterning the leg dielectric layer may include depositing the leg dielectric layer over the leg metal layer prior to patterning the leg metal layer and performing an in-situ dielectric and metal etch of the leg metal layer and the second leg dielectric layer.

At block 2208, the sacrificial layer may be removed to release the bridge structures and the vertical leg structures formed from portions of the passivation layer, the leg dielectric layer and the leg metal layer so that the bridge and legs are suspended above the readout integrated circuit and the contact structures are coupled to the bridge structures by the vertical leg structures.

The process described above for forming vertical microbolometer legs are merely illustrative. According to various embodiments, vertical legs for a microbolometer array may be formed using other processes. For example, in one embodiment, a process such as the process shown in FIGS. 23A-23F may be performed to form vertical legs using an etch stop layer.

FIGS. 23A-23F show cross sectional side views of a portion of a microbolometer array at various stages during production of microbolometer legs for the microbolometer array.

Figure 23A:
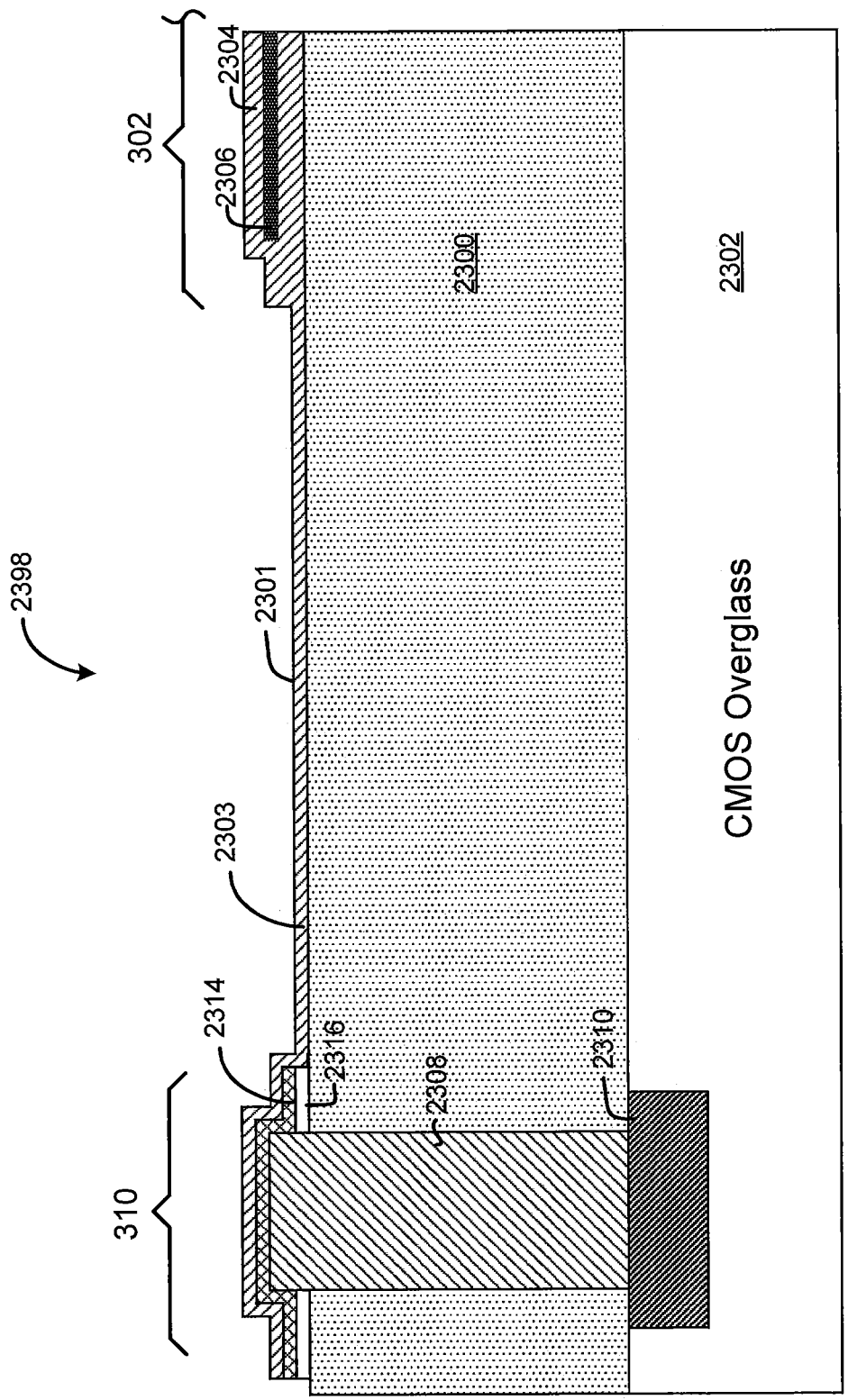
FIGS. 23A through 23F illustrate a processing overview for manufacturing a vertical leg, such as for the vertical legs of FIG. 3 using an etch stop layer, in accordance with an embodiment.

Turning now to FIG. 23A, a portion 2398 of a microbolometer array is shown having a contact 310 and a bridge 302. As shown, bridge 302 includes a sensor layer (e.g., a layer of temperature sensitive resistive material such as VOx) 2306 and one or more additional layers 2304 such as absorber layers. As shown, contact 310 may be formed from a vertical conductive portion such as metal stud 2308 and one or more layers such as a metal contact layer 2314 in contact with metal stud 2308. Contact 310 may include additional layers such as a passivation layer 2316 disposed under portions of metal layer 2314. As shown, an additional layer such as an etch stop layer 2303 (e.g., a layer of dielectric material) may be formed on sacrificial layer 2300 and may extend to form a portion of bridge 302 and/or contact 310.

Sacrificial layer 2300 may be formed from, for example, polyimide. Layers 2303 and 2316 may be formed from, as examples, silicon dioxide or silicon nitride. Metal layer 2314 may be formed from titanium, tungsten, copper, aluminum and/or other known metals.

Metal stud 2308 may be conductively coupled to a conductive contact such as contact 2310 of a substrate such as a readout integrated circuit (ROIC) substrate such as a complementary metal-oxide-semiconductor (CMOS) ROIC. In the example of FIG. 23A, contact 2310 is disposed in an overglass layer 2302 (e.g., a CMOS overglass layer) of the ROIC. Prior to forming vertical legs between the bridge 302 and the contact 310, bridge 302 may be disposed on sacrificial layer 2300 so that sacrificial layer 2300 fills a gap between bridges of the microbolometer array and the ROIC and runs continuously between the bridges and contacts of the microbolometer array.

Figure 23B:
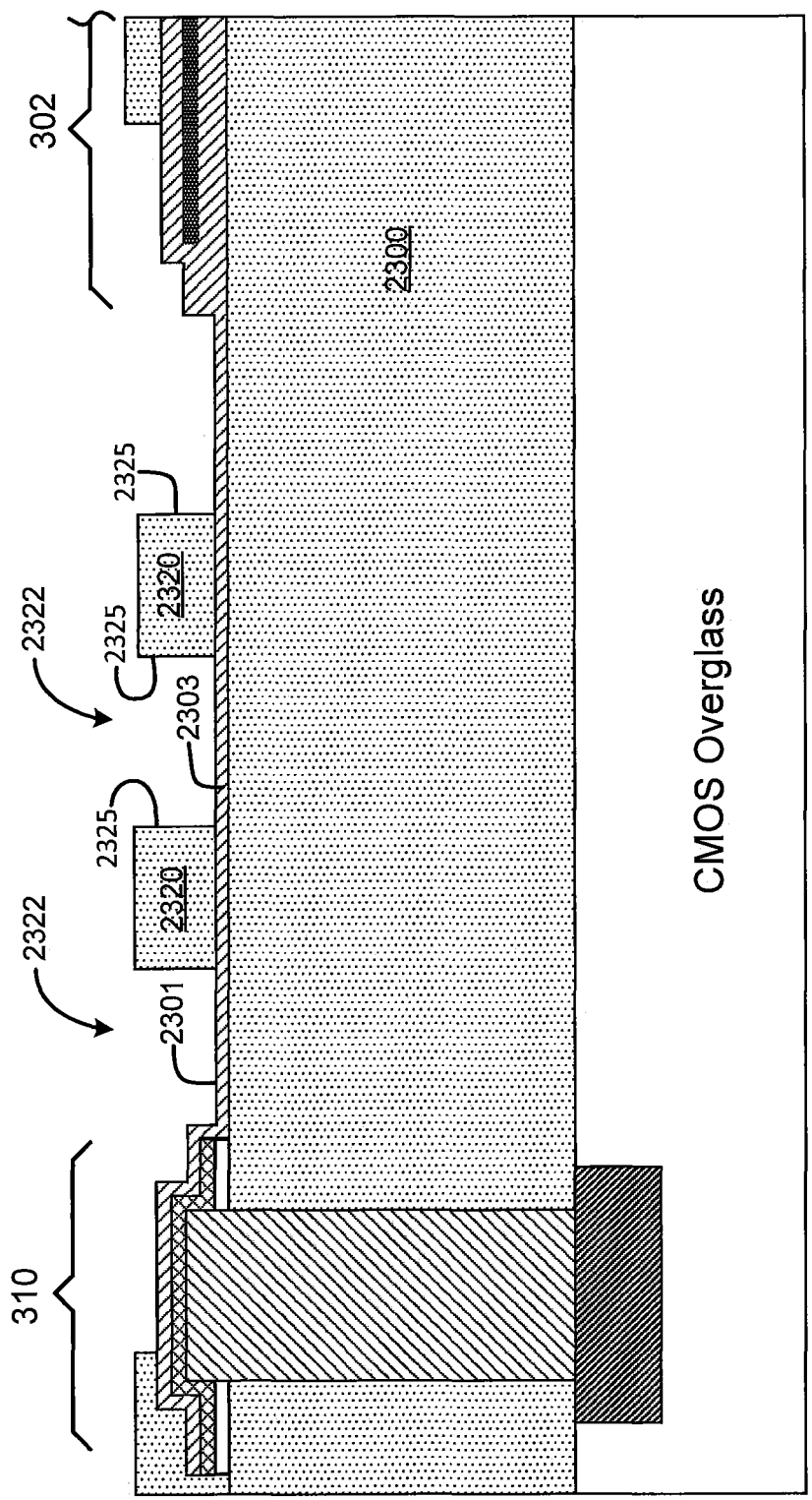

According to one embodiment, a process for forming vertical legs between bridge 302 and contact 310 may include depositing and patterning an additional sacrificial layer 2320 on etch stop layer 2303 as shown in FIG. 23B. Patterning the additional sacrificial layer 2320 may include forming openings 2322 in the additional sacrificial layer (e.g., at least partially between the bridge 302 and the contact 310) so that remaining portions of additional sacrificial layer 2320 have vertical sidewalls 2325. Openings 2322 may extend to the top surface 2301 of etch stop layer 2303.

Figure 23C:
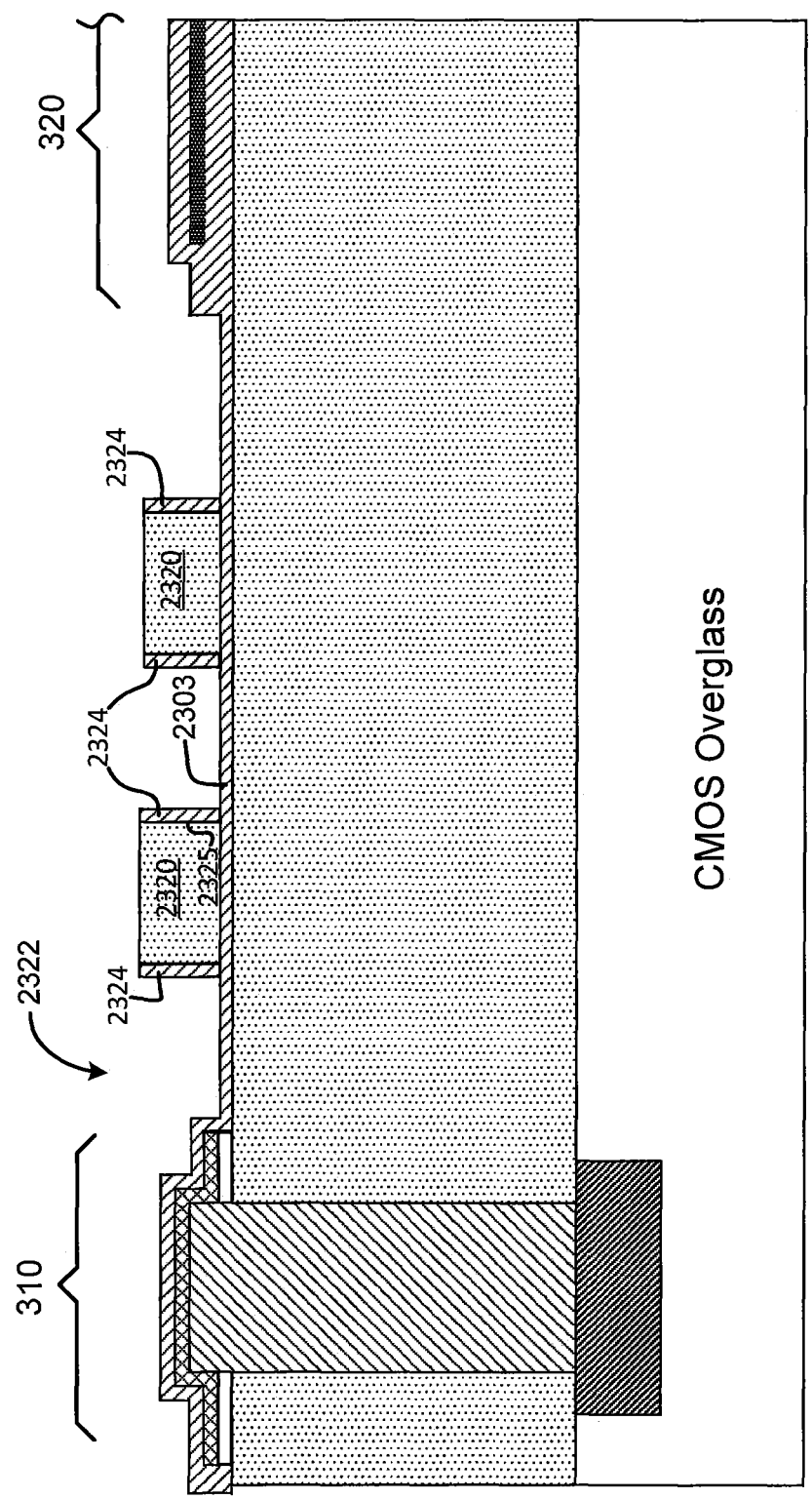
Figure 23D:
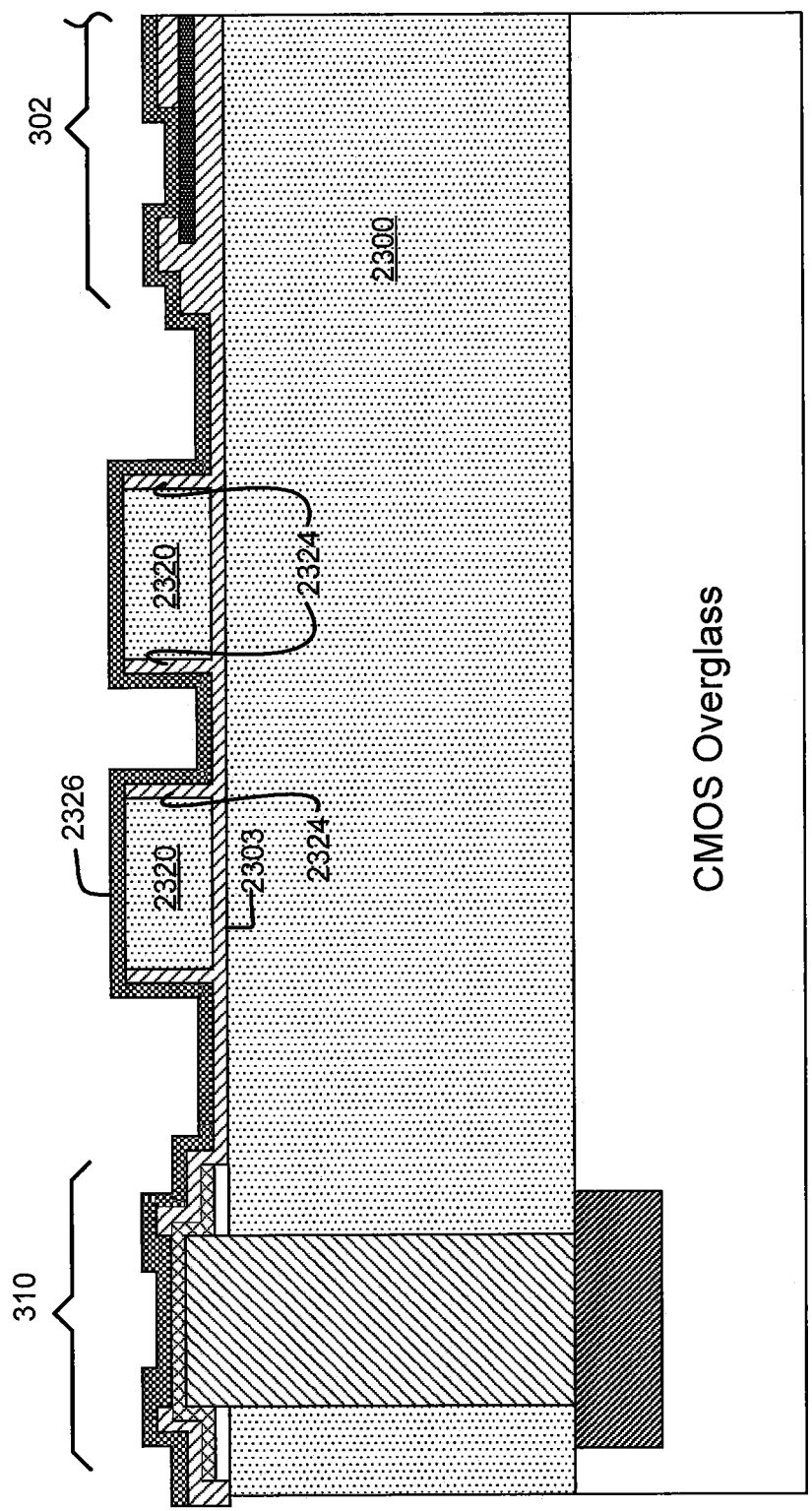

Following the deposition and patterning of additional sacrificial layer 2320, a dielectric layer 2324 may be deposited and patterned so that portions of the dielectric layer 2324 remain on sidewalls 2325 of additional sacrificial layer 2320 in openings 2322 as shown in FIG. 23C. A metal layer such as a leg metal layer 2326 may then be deposited over contact 310, portions of etch stop layer 2303, dielectric layer 2324 on sidewalls 2325, portions of additional sacrificial layer 2320, and bridge 302 as shown in FIG. 23D. If desired, openings may be formed in portions of etch stop layer 2303 that are disposed over contact 310 and bridge 302 to expose portions of metal layer 2314 and sensor layer 2306 so that metal layer 2326 can be deposited in contact with metal layer 2314 and sensor layer 2306. Metal layer 2326 may be deposited in a blanket deposition process.

Figure 23E:
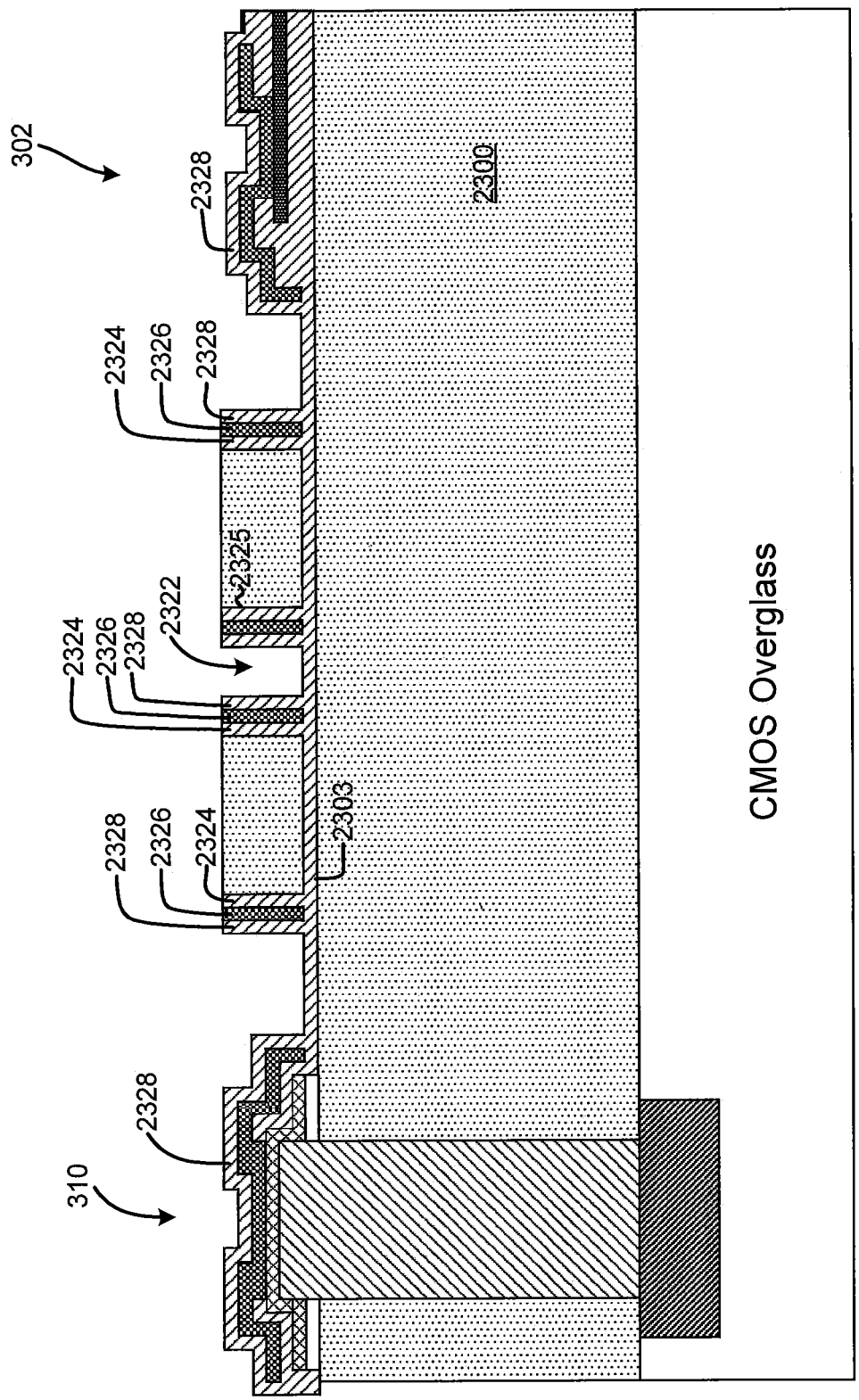

As shown in FIG. 23E, an additional dielectric layer 2328 may be deposited over metal layer 2326 and then metal layer 2326 and additional dielectric layer 2328 may be etched (e.g., in a masked spacer etch process) to remove portions of metal layer 2326 and additional dielectric layer 2328 from etch stop layer 2303 and additional sacrificial layer 2320. In this way, a dielectric-metal-dielectric stack may be formed vertically on sidewalls 2325 of openings 2322. Portions of the dielectric-metal-dielectric stack that are continuously coupled with the portions on sidewalls 2325 may also remain on contact 310 and bridge 302, thereby forming bridge contact 306 and a leg metal contact with metal layer 2314 of contact 310.

Dielectric layers 2324 and 2328 may be formed from, as examples, silicon dioxide or a silicon nitride. Metal layer 2326 may be a single metal layer formed form a homogeneous film of a single material or may include multiple materials (e.g., multiple layers of the same or different materials formed in multiple deposition operations). For example, metal layer 2326 may be formed from titanium, tungsten, copper, aluminum and/or other known metals.

Figure 23F:
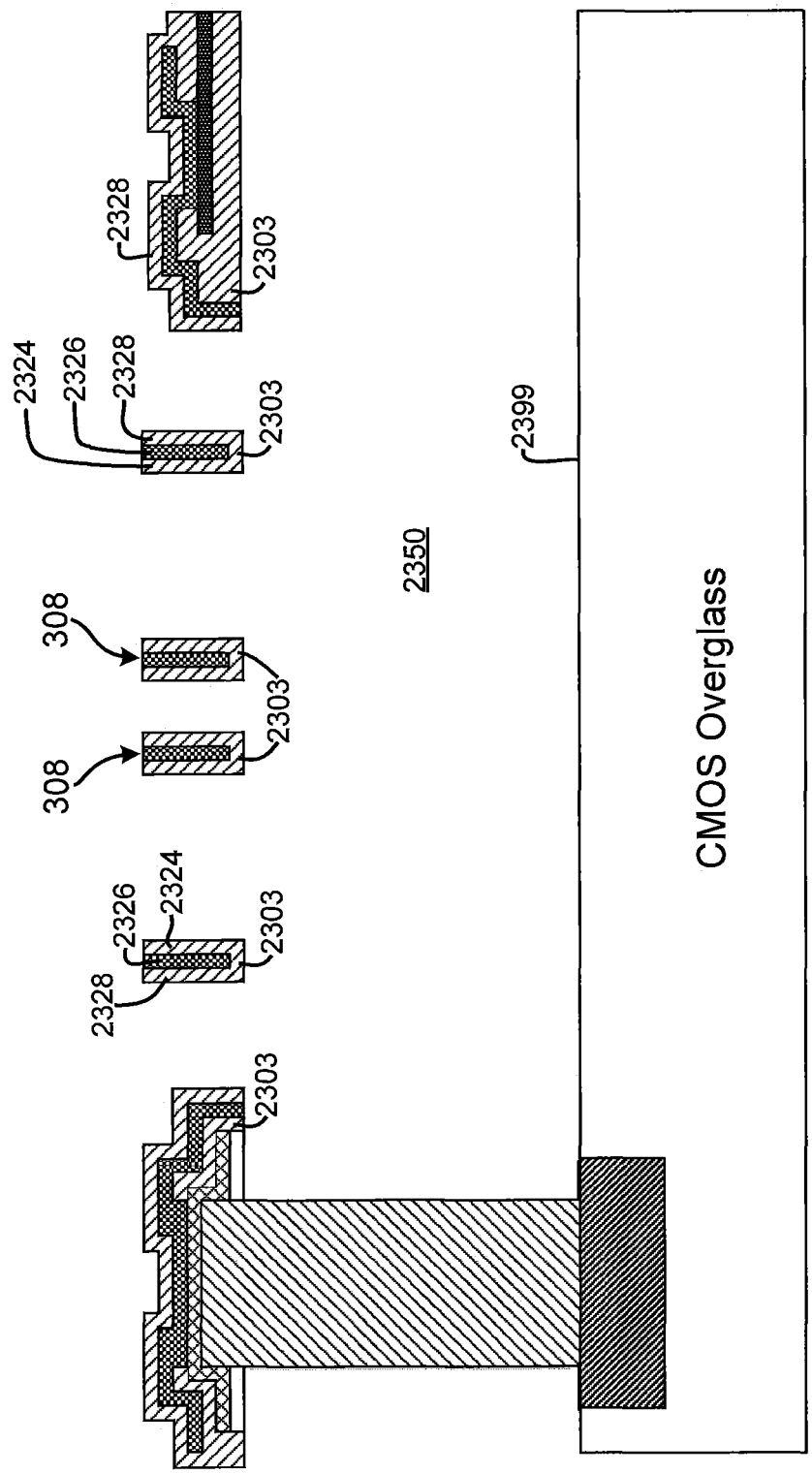

As shown in FIG. 23F, sacrificial layers 2300 and 2320 and portions of etch stop layer 2303 may then be removed to release bridge 302 and vertical legs 308 which remain suspended above the ROIC with a space 2350 interposed between the vertical legs and the ROIC. Vertical legs 308 of FIG. 23F may include at least a portion that runs non-perpendicularly to a plane defined by the surface 2399 of substrate 2302. For example, vertical legs 308 may run along a path that is parallel to the surface 2399. In another example, vertical legs 308 may run along a path that includes a portion that is parallel to surface 2399 and an additional portion that bends downward toward surface 2399 at a non-perpendicular angle.

Figure 24:
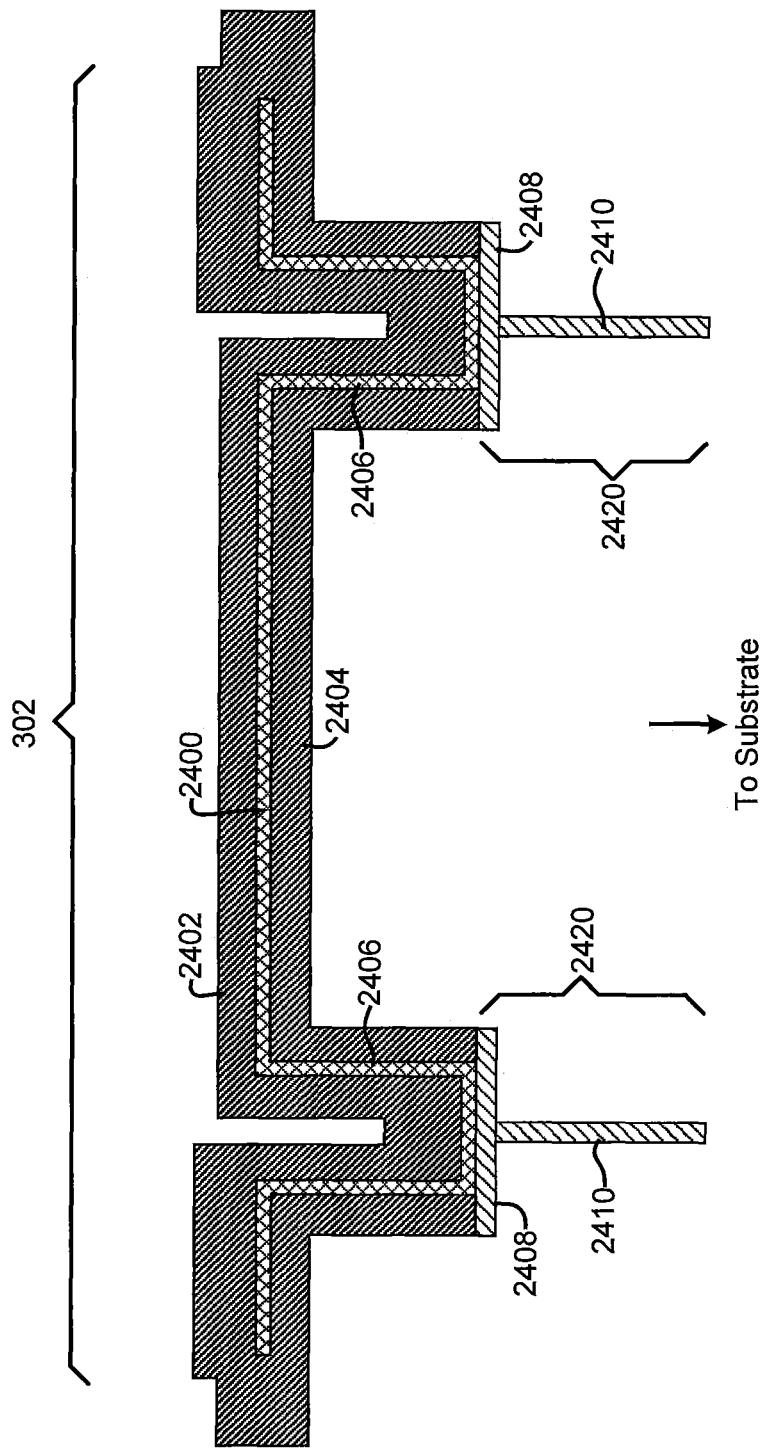
FIG. 24 shows a cross-sectional view of a portion of a focal plane array having legs, such as legs for an infrared detector, that are formed at least partially beneath a bridge portion of the infrared detector, in accordance with an embodiment.

FIG. 24 shows a cross-sectional side view of a microbolometer bridge that is coupled to legs formed beneath the bridge, according to an embodiment. In the example of FIG. 24, bridge 302 includes a sensor layer 2400 formed substantially between bridge dielectric layers 2402 and 2404. Sensor layer 240 (e.g., a temperature sensitive resistive material, such as VOx) may include one or more horizontal portions that extend in a plane that is parallel to the surface of a substrate over which bridge 302 is formed and may include portions 2406 that extend downward from the horizontal portions in the direction of the substrate (e.g., perpendicularly to the surface of the substrate. Portions 2406 may extend to contact one or more legs such as legs 2420 formed beneath the bridge 302 (e.g., disposed at least partially between bridge 302 and the substrate over which the bridge is disposed).

As shown in FIG. 24, legs 2420 are formed form a conductive material having a horizontal portion 2408 in contact with sensor layer 2306 and a vertical portion 2410 that extends perpendicularly to horizontal portion 2408. However, this is merely illustrative. In various embodiments, legs 2420 may include vertical and/or horizontal portions and/or may be covered partially or completely in an insulating material as in, for example, any of the examples described herein.

Figure 25:
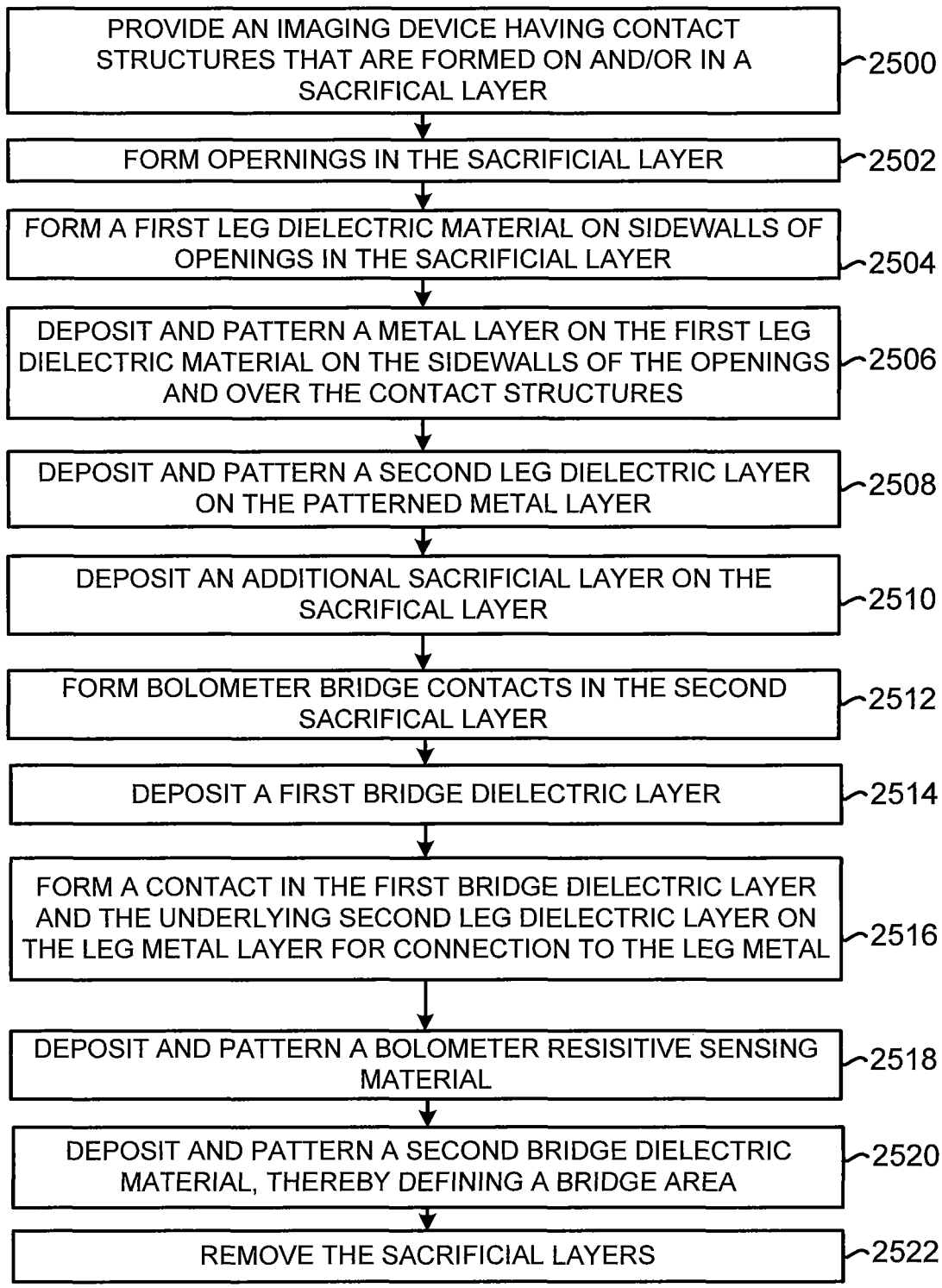
FIG. 25 illustrates a flow diagram for manufacturing a focal plane array having legs, such as legs for an infrared detector, that are formed at least partially beneath a bridge portion of the infrared detector, in accordance with an embodiment.

Illustrative operations that may be performed to form a bridge of the type shown in FIG. 24 are shown in FIG. 25.

At block 2500, an imaging device having contact structures that are formed on and/or in a sacrificial layer may be provided. The imaging device may include a partially fabricated focal plane array on which a sacrificial layer such as a polyimide layer is formed on a substrate such as a readout integrated circuit substrate. The contact structures may include an electrical contact on the substrate and, if desired conductive elements that extend from the electrical contact on the ROIC through some or all of the sacrificial layer. The conductive elements may include a stud or a basket contact and, if desired, one or more additional structures such as passivation layers, metal layers, and/or dielectric layers formed over the conductive elements.

At block 2502, openings may be formed in the sacrificial layer.

At block 2504, a first leg dielectric material may be formed at least on sidewalls of the openings in the sacrificial layer. Forming the first leg dielectric material on the sidewalls of the openings may include depositing the first leg dielectric layer and performing a spacer etch of the first leg dielectric layer.

At block 2506, one or more conductive layers such as a leg metal layer may be deposited (e.g., using a blanket metal deposition) and patterned on the first leg dielectric material that is on the sidewalls of the openings and over at least some of the contact structures. The leg metal layer may be formed in contact with a metal layer of the contact structures.

At block 2508, a second leg dielectric layer may be deposited and patterned on the leg metal layer. Patterning the second leg dielectric layer may include depositing the second leg dielectric layer over the leg metal layer prior to patterning the leg metal layer and performing an in-situ dielectric and metal etch of the leg metal layer and the second leg dielectric layer.

At block 2510, an additional sacrificial layer may be deposited on the sacrificial layer.

At block 2512, one or more bolometer bridge contacts may be formed in the second sacrificial layer.

At block 2514, a first bridge dielectric layer may be deposited.

At block 2516, one or more contacts may be formed in the first bridge dielectric layer and the underlying second leg dielectric layer on the leg metal layer for connection to the leg metal layer.

At block 2518, a bolometer resistive sensing material (e.g., a temperature sensitive resistive material such as VOx) may be deposited and patterned to form sensor layers of the bolometer bridges.

At block 2520, as second bridge dielectric material may be deposited and patterned, thereby defining a bridge area of each microbolometer formed over at least portions of the underlying leg materials.

At block 2522, the sacrificial layer and the additional sacrificial layer may be removed to release the bridge structures and the vertical leg structures so that the bridge and legs that are formed beneath the bridge are suspended above the substrate and the contact structures are coupled to the bridge structures by the vertical leg structures.

Where applicable, various embodiments of the invention may be implemented using hardware, software, or various combinations of hardware and software. Where applicable, various hardware components and/or software components set forth herein may be combined into composite components comprising software, hardware, and/or both without departing from the scope and functionality of the invention. Where applicable, various hardware components and/or software components set forth herein may be separated into subcomponents having software, hardware, and/or both without departing from the scope and functionality of the invention. Where applicable, it is contemplated that software components may be implemented as hardware components and vice-versa.

Software, in accordance with the invention, such as program code and/or data, may be stored on one or more computer readable mediums. It is also contemplated that software identified herein may be implemented using one or more general purpose or specific purpose computers and/or computer systems, networked and/or otherwise. Where applicable, ordering of various steps described herein may be changed, combined into composite steps, and/or separated into sub-steps to provide features described herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected is:

1. A method of forming an infrared imaging device, the method comprising:
    providing a device having a bolometer bridge structure and a contact structure, wherein the bolometer bridge structure is formed on a sacrificial layer, and wherein the contact structure extends through the sacrificial layer;
    depositing an additional sacrificial layer over the sacrificial layer;
    forming openings in the additional sacrificial layer;
    forming a leg structure having at least a first portion that runs between the bolometer bridge structure and the contact structure, wherein the forming of the leg structure comprises forming portions of a first layer on sidewalls of the openings, and wherein the leg structure comprises the portions of the first layer; and
    removing the sacrificial layer and the additional sacrificial layer to suspend the bolometer bridge structure and the leg structure above a substrate of the infrared imaging device, wherein the first portion of the leg structure has a first dimension that extends in a first direction that is substantially perpendicular to a plane defined by a surface of the substrate, wherein the first portion of the leg structure has a second dimension that extends in a second direction that is substantially parallel to the plane, wherein the portions of the first layer have a first dimension that extends in the first direction and a second dimension that extends in the second direction, and wherein the first dimension of the portions of the first layer is greater than the second dimension of the portions of the first layer.

2. The method of claim 1, wherein the forming of the leg structure further comprises forming first portions of a second layer on the portions of the first layer, wherein the leg structure further comprises the first portions of the second layer.

3. The method of claim 1, wherein:
    the infrared imaging device comprises a focal plane array; and
    the method further comprises integrating the focal plane array into an infrared camera.

4. The method of claim 1, wherein the device includes an etch stop layer on the sacrificial layer and wherein the depositing of the additional sacrificial layer over the sacrificial layer comprises depositing the additional sacrificial layer on the etch stop layer.

5. The method of claim 1, wherein the first layer is a metal layer or a dielectric layer.

6. The method of claim 2, wherein the forming of the leg structure further comprises:
    depositing the first layer on portions of the sacrificial layer and the additional sacrificial layer;
    performing a spacer etch of the first layer so that the portions of the first layer remain on the sidewalls;
    depositing the second layer over the portions of the first layer on the sidewalls, over the bolometer bridge structure, and over the contact structure of the device;
    depositing a third layer over the second layer; and
    removing second portions of the second layer and portions of the third layer, wherein the second portions of the second layer are removed such that the first portions are on a side of the portions of the first layer.

7. The method of claim 2, wherein the first portions of the second layer have a first dimension that extends in the first direction and a second dimension that extends in the second direction, and wherein the first dimension of the first portions of the second layer is greater than the second dimension of the first portions of the second layer.

8. The method of claim 2, wherein the first layer is a dielectric layer, wherein the second layer is a metal layer, and wherein the leg structure runs non-perpendicularly to the plane.

9. The method of claim 2, wherein the forming of the leg structure further comprises:
    depositing the second layer over the portions of the first layer, over the bolometer bridge structure, and over the contact structure; and
    removing second portions of the second layer such that the first portions remain on a side of the portions of the first layer.

10. The method of claim 2, wherein the portions of the first layer and the first portions of the second layer are adjacent to each other and stacked in a direction along the plane.

11. The method of claim 2, wherein the forming of the leg structure further comprises:
    forming portions of a third layer on the first portions of the second layer, wherein the leg structure further comprises the portions of the third layer, wherein the portions of the first layer are on a first side of the first portions of the second layer, wherein the portions of the third layer are on a second side of the first portions of the second layer, and wherein the first side is opposite the second side.

12. The method of claim 11, wherein:
    the first layer is a dielectric layer,
    the second layer is a metal layer,
    the third layer is a dielectric layer, and
    the portions of the first layer, the first portions of the second layer, and the portions of the third layer are adjacent to each other and stacked in a direction along the plane.

13. A method of forming an infrared imaging device, the method comprising:
  providing a device having a bolometer bridge structure and a contact structure, wherein the bolometer bridge structure is formed on a sacrificial layer, and wherein the contact structure extends through the sacrificial layer;
  forming openings in the sacrificial layer;
  forming a leg structure having at least a first portion that runs between the bolometer bridge structure and the contact structure, wherein the forming of the leg structure comprises forming portions of a first layer on sidewalls of the openings, and wherein the leg structure comprises the portions of the first layer; and
  removing the sacrificial layer to suspend the bolometer bridge structure and the leg structure above a substrate of the infrared imaging device, wherein the first portion of the leg structure has a first dimension that extends in a first direction that is substantially perpendicular to a plane defined by a surface of the substrate, wherein the first portion of the leg structure has a second dimension that extends in a second direction that is substantially parallel to the plane, wherein the portions of the first layer have a first dimension that extends in the first direction and a second dimension that extends in the second direction, and wherein the first dimension of the portions of the first layer is greater than the second dimension of the first layer.

14. The method of claim 13, wherein:
  the infrared imaging device comprises a focal plane array; and
  the method further comprises integrating the focal plane array into an infrared camera.

15. The method of claim 13, wherein:
  the device includes a passivation layer formed on the sacrificial layer, wherein the forming of the openings comprises forming the openings in the sacrificial layer and the passivation layer;
  the first layer is a metal layer formed over portions of the passivation layer, over the bolometer bridge structure, and over the contact structure; and
  the forming of the leg structure further comprises:
    forming a dielectric layer over the metal layer; and
    removing portions of the metal layer and the dielectric layer.

16. The method of claim 15, wherein:
  the infrared imaging device comprises a focal plane array; and
  the method further comprises integrating the focal plane array into an infrared camera.

17. The method of claim 13, wherein the forming of the leg structure further comprises forming first portions of a second layer on the portions of the first layer, wherein the leg structure further comprises the first portions of the second layer.

18. The method of claim 17, wherein the forming of the leg structure further comprises:
  depositing the first layer on portions of the sacrificial layer;
  performing a spacer etch of the first layer so that the portions of the first layer remain on the sidewalls;
  depositing the second layer over the portions of the first layer on the sidewalls, over the bolometer bridge structure and, over the contact structure of the device;
  depositing a third layer over the second layer; and
  removing second portions of the second layer and portions of the third layer, wherein the second portions of the second layer are removed such that the first portions are on the portions of the first layer.

19. The method of claim 17, wherein the first portions of the second layer have a first dimension that extends in the first direction and a second dimension that extends in the second direction, wherein the first dimension of the first portions of the second layer is greater than the second dimension of the first portions of the second layer, and wherein the portions of the first layer and the first portions of the second layer are adjacent to each other and stacked in a direction along the plane.

20. The method of claim 17, wherein the forming of the leg structure further comprises:
  forming portions of a third layer on the first portions of the second layer, wherein the leg structure further comprises the portions of the third layer, wherein the portions of the first layer are on a first side of the first portions of the second layer, wherein the portions of the third layer are on a second side of the first portions of the second layer, and wherein the first side is opposite the second side.

* * * * *